United States Patent [19]
Endriz

[11] Patent Number: 5,168,401
[45] Date of Patent: Dec. 1, 1992

[54] BRIGHTNESS CONSERVING OPTICAL SYSTEM FOR MODIFYING BEAM SYMMETRY

[75] Inventor: John Endriz, Belmont, Calif.

[73] Assignee: Spectra Diode Laboratories, Inc., San Jose, Calif.

[21] Appl. No.: 696,634

[22] Filed: May 7, 1991

[51] Int. Cl.$^5$ .......................... G02B 27/10; G02B 5/04
[52] U.S. Cl. ................................. 359/625; 359/619; 359/627; 359/719; 359/834
[58] Field of Search .................. 385/89, 93; 359/301, 359/618, 619, 625, 627, 719, 834; 250/494.1; 372/100

[56] References Cited

U.S. PATENT DOCUMENTS

| | | | |
|---|---|---|---|
| 4,428,647 | 1/1984 | Sprague et al. | 350/167 |
| 4,440,470 | 4/1984 | Khoe | 350/96.20 |
| 4,763,975 | 8/1988 | Scifres et al. | 350/96.15 |
| 4,812,012 | 3/1989 | Terada et al. | 350/96.24 |
| 4,939,630 | 7/1990 | Kikuchi et al. | 359/618 X |

OTHER PUBLICATIONS

E. A. Cunningham et al., "Collimated Light Source with Laser Diode and Microcylindrical Lens," *IBM Technical Disclosure Bulletin*, vol. 19, No. 2, Jul. 1976.

*Primary Examiner*—Bruce Y. Arnold
*Assistant Examiner*—David R. Parsons
*Attorney, Agent, or Firm*—Schneck & McHugh

[57] ABSTRACT

An optical system for use in conjunction with a one or two dimensional array of high brightness sources where such sources are individually rotated by multiple reflective elements and in turn may be captured by beam filling optics and subsequently re-imaged by symmetric and asymmetric optics where the asymmetric optics preferentially image a single dimension while leaving the focus in the second dimension largely unaffected. In this manner and by properly selecting the spacing as well as the width of the line sources, and by properly designing the symmetric and asymmetric optics, the array of high brightness sources can be reformatted in a brightness conserving manner that allows the reformatted beam to simultaneously have an arbitrary ratio of image length to image width and arbitrary divergences in the respective dimensions. The multiple reflective elements provide the means of re-formatting between dimensions and in general consist of two reflecting surfaces that rotate sources such that the source axis initially parallel to the line passing through all sources is rotated to be perpendicular to the line passing through all sources. The system is particularly useful in reformatting beams from multiple sources of arrays of semiconductor lasers.

60 Claims, 12 Drawing Sheets

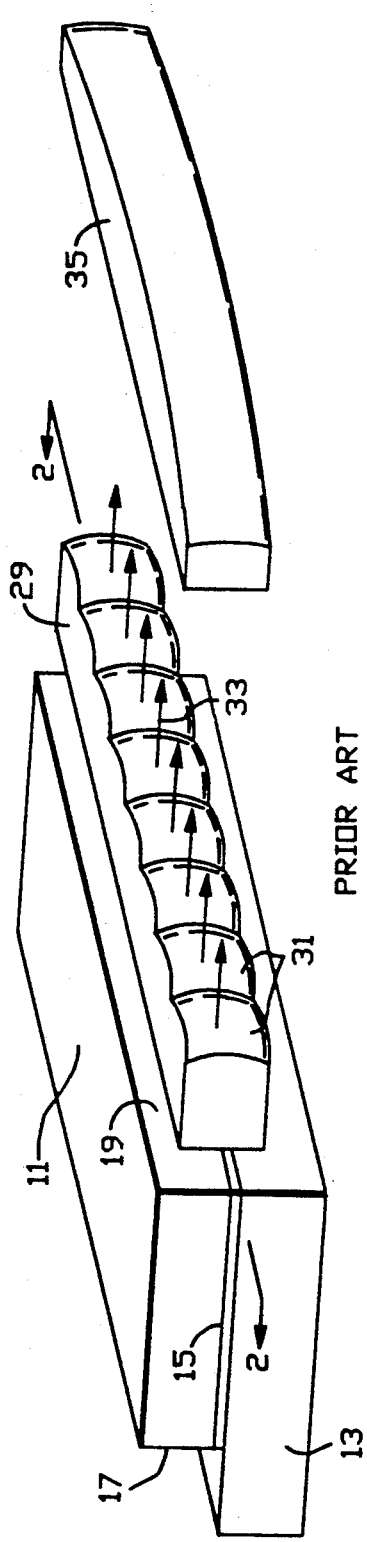
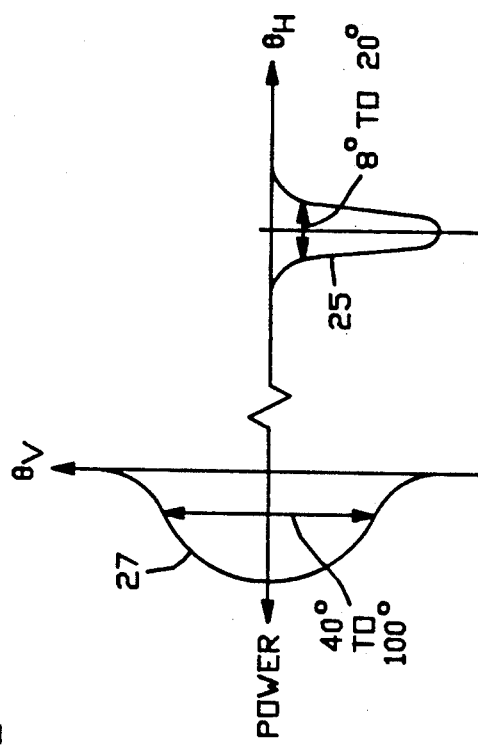
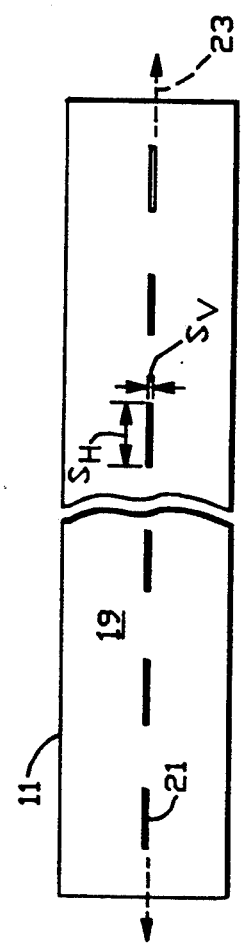
FIG.-1 PRIOR ART
FIG.-2 PRIOR ART
FIG.-3 PRIOR ART

BRIGHTNESS CONSERVING OPTICAL SYSTEM FOR MODIFYING BEAM SYMMETRY

DESCRIPTION

1. Technical Field

The present invention relates to light source array systems for reducing aperture and divergence asymmetries in the beam of light emitting sources.

2. Background Art

Monolithic light sources, such as laser diode arrays, often called "laser bars" or 2-D surface emitting arrays, have very high spatial aperture and angular divergence aspect ratios that restrict their use in many practical applications. For example, a typical laser bar 11 might have an array of ten to twenty collinear, laterally spaced apart, laser light emitting sources 21, as illustrated in FIG. 2. Each source 21 is characterized by a lateral size dimension $S_H$, which typically is about 20 to 500 μm, and by a transverse size dimension $S_V$, which typically is less than 2 μm. The "lateral" direction is that which is along the array axis 23 passing through each of the sources, while the "transverse" direction is along a line lying on the front light emitting facet 19 of the laser bar 11 perpendicular to the array axis 23. There is also a "longitudinal" direction perpendicular to both the lateral and transverse directions generally following the principal direction of propagation of the laser light emitted from the individual sources 21. A laser bar 11 having twenty sources, each with a 50 μm × 1 μm emissive area, spaced apart on 500 μm centers would have a total aperture size of 1 mm × 1 μm for a 1000:1 aspect ratio. As illustrated in FIG. 3, each source 21 is also characterized by differing lateral and transverse divergence profiles 25 and 27, with a typical full width spread in the lateral divergence angle $2 \cdot \theta_H$ being about 8° to 20° (measured to include 95% of the optical power) and a typical full width spread in the transverse divergence angle $2 \cdot \theta_V$ being about 40° to 100°. Thus, the source divergence has an aspect ratio in the range of about 1:5. The average brightness of a 5 W laser with a 1 mm × 1 μm total aperture and 10 × 50 full width divergence would be about 32 mW/μm² · sr. A 2-D diode array may consist of many rows of linear light sources with comparable aspect ratios.

In order to expand the range of possible uses for laser bars and 2-D arrays, designers have proposed a number of different optical systems using some combination of one or more simple lenses, cylindrical lenses, microlens arrays and fiberoptic waveguides to reimage the sources so as to reduce one of the asymmetries inherent in a laser bar. Lens systems reformat the high aspect ratio source light in a manner that conserves brightness, which is an advantage in applications, such as laser pumping, that require very high brightness sources. One such system is shown in FIG. 1. As described in U.S. Pat. No. 4,428,647, a laser bar 11 is mounted on a heat sink 13. The laser bar has one or more electrically pumped active regions 15 between a pair of facets 17 and 19 defining a resonant optical cavity. Beam filling optics 29 consisting of an array of lenslets 31 substantially collimate the light in the lateral and transverse directions after allowing the light beams from the individual sources 21 to expand to fill up the dead space between them. A system 35 of one lens, as shown, can reimage the extended source into a single asymmetric spot, or more typically a pair of cylindrical lenses, focuses the light in both the lateral and transverse directions into a single spot. This scheme of FIG. 1 conserves the inherent brightness of the optical source aperture.

However, one major disadvantage of such brightness conserving lens systems is that they are incapable of simultaneously symmetrizing both the physical aperture of the source and the source divergence. Such systems cannot mix the two orthogonal optical components of the image. The lateral component of brightness $B_H$ is approximately inversely proportional to the product of the lateral components of the total horizontal size dimension $N \times S_H$, where N is the number of sources in the array, and the sine of half the spread of the divergence angle $\theta_H$. That is, $B_H \propto (N \times S_H \sin \theta_H)^{-1}$ transverse component of brightness $B_V$ is approximately inversely proportional to the product of the transverse components of the size dimension $S_V$ and the size of half the spread of the divergence angle $\theta_V$. That is, $B_V \propto (S_V \sin \theta_V)^{-1}$. Consequently, it follows from brightness conservation under simple lensing that the products $N \times S_H \sin \theta_H$ and $S_V \sin \theta_V$ must each be essentially constant, and hence symmetrizing the source shape ($N \times S_H = S_V$) results in asymmetric divergence, and vice versa. Either divergence angle or aperture shape may be symmetrized in such a laser system, but not both simultaneously, if simple lenses are used. In view of this we can define an intrinsic asymmetry ratio A of the full multi-element laser array to be $A \equiv B_V/B_H = (N \times S_H \sin \theta_H)/(S_V \sin \theta_V)$. In the typical example given above, the laser bar has $A = 227$. Note that in a brightness conserving lens system of the type just described, the asymmetry ratio A will remain constant, regardless of the lenses used.

Implications of this invariant asymmetry under simple lensing are significant, for they prevent using the re-formatted beam in many practically important applications. For example, a class of applications of major importance is to be able to inject light into a round optical fiber in a brightness conserving manner. If the source is symmetrized to a square to roughly match the round fiber input, but resultant divergence is extremely asymmetric, then that divergence asymmetry will mix within the fiber causing a very large degradation in brightness out of the fiber. To inject light into a round fiber in a brightness conserving manner, both shape and divergence need to be approximately symmetrized. As a second example, many applications exist where one wants to project a light source into the far field with a projected symmetric and minimal divergence using a single lens with a small maximum lens dimension; that is, with as small a lens as possible. To achieve a symmetric far field, the source size must be symmetric. If this results in a large source divergence asymmetry, then the projection lens must be extremely asymmetric to capture this light. This often requires lens maximum dimensions which are many times larger than necessary for a source symmetrized in both shape and divergence. Other important examples exist.

Optical systems have been developed using optical fibers which are more complex than simple lenses and therefore allow simultaneous symmetrizing of both source shape and source divergence. Unfortunately, fiber coupling schemes described to date have substantially degraded source brightness in achieving simultaneous symmetrizing of shape and divergence.

In U.S. Pat. No. 4,763,975, Scifres et al. describe optical systems for producing a bright light output that generally features fiberoptic waveguides having either squashed or oblong cores at their input end. In one embodiment, a semiconductor diode laser bar emitting an array of light elements from an elongated emissive area is optically coupled to plural fiberoptic waveguides. The emissive area is divided into plural segments, each segment including at least one emitted light element, and an input end of each waveguide is disposed in front of a segment of the emissive area of the laser bar. The core dimensions of the oblong fibers, which could have a rectangular cross-section, correspond to the dimensions of that segment. Each waveguide should also have an effective numerical aperture that corresponds to the divergences characteristic of the emitted light elements so as to accept and guide most of the emitted light. At their output ends, the waveguides are stacked or otherwise arranged into a bundle, such that the dimensions of the emissive area of the bundle at the output end of the waveguides are less elongated than that of the laser bar at the input end of the waveguides. Focussing optics proximate to the output end might be used to image the light from the bundle into a very bright spot.

While this fiber coupling scheme achieves very high brightness by attempting to approximately match the fiber shape to the line sources of light to which each fiber couples, it falls far short of true brightness conservation, primarily because the practical limit for fiber thickness that can be achieved falls short of the shape required. For example, a 30 μm thick fiber proximity coupled to a 2 μm wide line source degrades brightness by a factor (15). Also, any asymmetry in divergence entering the fiber for this or other related schemes, will quickly be mixed within the fiber, further degrading brightness.

It is an object of the invention to provide a brightness conserving optical system for improving light source array beam symmetry.

DISCLOSURE OF THE INVENTION

The object has been met with a system having an array of multiple, spaced apart light sources, such as a laser bar, and a corresponding array of multiple reflective elements arranged in front of the array of sources, such as an array of mirrors or prism structures, for reimaging the array of sources into a transformed virtual array of sources, such that the virtual image of each light source has been rotated in the transformed array about its array axis, whereby the lateral and transverse size dimensions and divergence angles of the source light have undergone a rotational transformation. Preferably, the rotation will be a complete 90° so that the roles of the lateral and transverse components in the original and transformed array will have exchanged places. A simple rotation of the sources does not reduce brightness, but it does reduce the overall intrinsic asymmetry ratio of the light source array so that it is substantially closer to unity, and so that the light output is easier to symmetrize. A two-dimensional light source array may also be symmetrized by providing a corresponding two-dimensional array of lenses and a two-dimensional array of turning prisms or mirrors.

An embodiment of the present invention has an array of prism structures to carry out the rotational transformation or reimaging. Each prism structure includes a pair of abutting prisms, and preferably also a lenslet that is part of a beam filling lens array. A first prism has a light admitting face positioned in front of the source in the path of light emitted from that source and a first planar reflective surface disposed and oriented to redirect the admitted light into a new direction that has at least a lateral component of light propagation. The second prism is in the path of the redirected light, that is to one side of the first prism, and has a second planar reflective surface disposed and oriented to again redirect the already once redirected light into direction that has at least a transverse component of light propagation. The result of this pair of reflections and redirections from each prism structure in the array is that while the array axis in the virtual image remains parallel to the array axis of the actual array of sources, the virtual images of the individual sources themselves have been rotated about the array axis. Another result is that the light is no longer propagating in the same longitudinal direction it started in, but now has been turned at least partially upward or downward, i.e. transversely. The microlens array is positioned in the path of the twice redirected light at an effective path length away from the sources such that upon reaching the lenslets of the lens array the dead space between sources has been filled by the effect of light divergence. The focal length of each lenslet should be equal to that effective path length to collimate the light. Means for focussing the collimated light into a spot, preferably one where dimensions and convergence angles of the spot have been symmetrized, are provided in the path of the collimated light, if so desired.

BRIEF DESCRIPTION OF THE DRAWINGS

FIG. 1 is a perspective view of a laser array system of the prior art.

FIG. 2 is a plan view of the front light emitting face of the laser bar in the system in FIG. 1.

FIG. 3 is a pair of graphs of optical power versus respective transverse and lateral divergence angles $v_V$ and $\theta_H$ illustrating the divergence profile of each source in the laser bar of FIG. 2.

BEST MODE OF CARRYING OUT THE INVENTION

Figure 4:
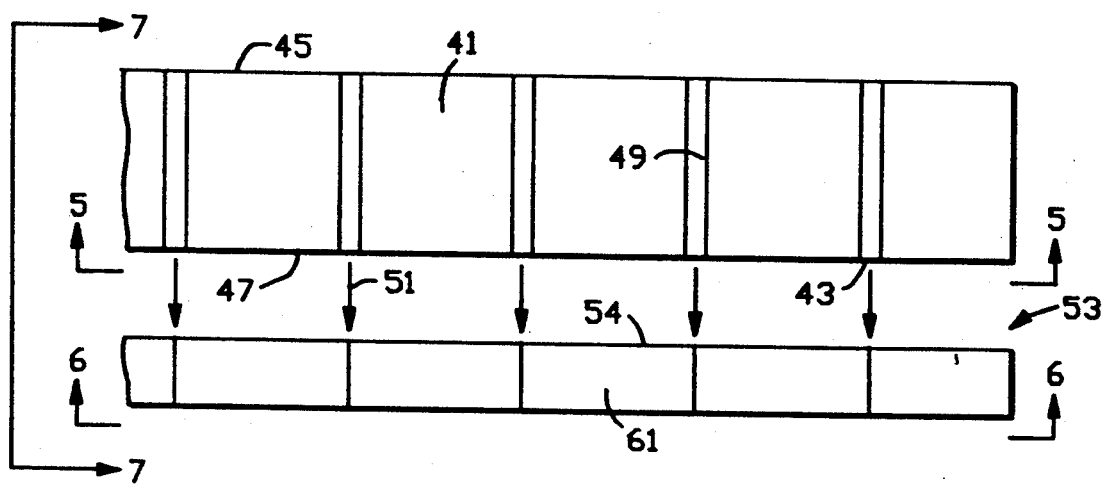
FIGS. 4–7 are respective top plan, laser bar front end, system front end and side views of a laser array system of the present invention.
Figure 5:
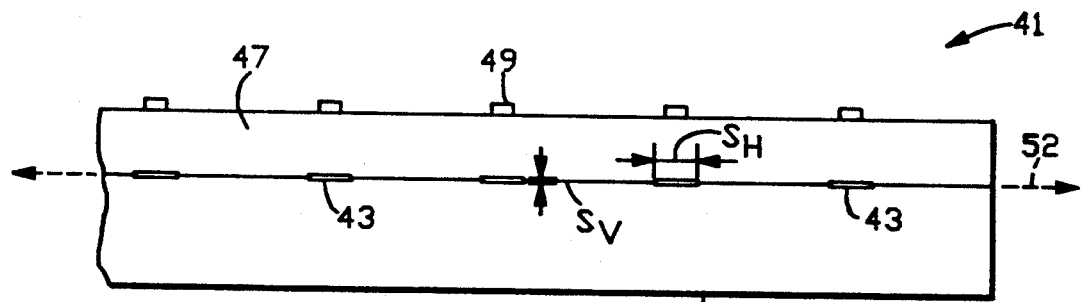

With reference to FIGS. 1-3, a laser array system of the prior art capable of approximately conserving brightness, but not capable of simultaneously making both the size dimensions and divergence angles of the source image symmetric with respect to the vertical and horizontal directions, has been described above. Another system of the prior art, set forth in U.S. Pat. No. 4,763,975 and briefly described above, uses fiberoptic waveguides to increase the symmetry of the size dimensions without adversely affecting the divergence angles. However, because even the thinnest practical fiber ribbons have a thickness which is substantially larger than the vertical size dimension of a laser array source, significant brightness loss is unavoidable.

With reference to FIGS. 4-7, a brightness conserving, asymmetry reducing, laser array system of the present invention includes a linear high brightness light source, such as a monolithic semiconductor laser diode array or "laser bar" 41. Such laser bars are typically multilayer heterostructures having an active gain region 43 formed from one or more thin layers proximate to a semiconductor p-n junction. A resonant optical cavity is provided by a feedback means for the light generated in the active region 43, such as a distributed feedback (DFB) or Bragg reflector grating, or more commonly by a pair of opposed reflective facets 45 and 47 bounding the active region 43. The laser bar 41 may be electrically pumped by injecting current through conductive contacts 49 on top and bottom surfaces of the laser bar. The contacts 49 may be configured as a set of parallel thin contact stripes, or the laser bar may be provided with other means for confining current, or both, as is well known in the art. The laser bar 41 is mounted on a heat sink 42. The laser light may be optically confined within the laser by gain guiding, or by real refractive index waveguides, or both. As a result, the laser bar 41 provides an array of collinear, laterally spaced, laser light emitting sources. The light 51 typically emerges through one of the facets 47.

As in the prior art laser array systems described above, the laser bar 41 produces an array of light sources that is characterized by a horizontal array axis 52 passing through each of the sources 43 at the output facet 47, and where each source is characterized by a lateral size dimension $S_H$ in the direction of the axis 52 and by a transverse size dimension $S_V$ in the direction perpendicular to the axis 52 on the facet 47. Likewise, each source is also characterized by lateral and transverse divergence angles $\theta_H$ and $\theta_V$. For example, a typical laser bar 41 might have 10 or 20 sources, each emitting 500 mW-1000 mW of optical power, for a total power output of approximately 10-20 W. Each of the sources might have a lateral size dimension $S_H$ in a range from 3-500 μm, a transverse size dimension $S_V$ in a range from less than 1 μm to about 2 μm, a lateral divergence angle $\theta_H$ in a range from ±4° to about ±10°, and a transverse divergence angle 8V in a range from about ± 20° to about ±50°. The particular laser bar 41 used will be matched with the remainder of the system in a manner to be described below. Alternatively, an extended semiconductor laser source with a continuous line of emission may be used. The prism-and-lens array structure 53 to be described below would then effectively break up the extended source into multiple segments and then rotationally transform each segment as though each were a separate source.

Here and throughout the remainder of this description, divergence angles given are the limits on each side of a line in the principal direction of the light beam emitted from a source, between which 95% of the optical power is located. These values differ from the full-width-half-maximum and width-at-e$^{-1}$-of-maximum values (respectively 76% and 84% of power for Gaussian beams) sometimes used to characterize divergence, but the 95%-of-power values used here are more convenient for purposes of implementing this invention, since the object is to preserve source power, as well as brightness. The values given will be for the half width of the divergence profile as opposed to the full width.

The array of laser light beams 51 emitted from the laser bar 41 is directed longitudinally toward a prism-and-lens array structure 53 within which each individual beam 51 will be rotated with respect to the array axis 52 preferably by 90°. The prism-and-lens array structure 53 is a body of transparent material such as glass or plastic, typically with an index of refraction of about 1.7, which has been shaped, by etching or molding or some other process, to form a set of prism-and-lens combinations, one for each light beam 51 in the array. Each prism-and-lens combination in the set forming the array structure 53 includes a prism structure with a pair of reflective mirror surfaces 55 and 57 thereon and a lenslet 61 with a curved lens surface, that is part of a microlens array for the array of light beams 51.

Each light beam 51 thus passes through a front surface 54 of the prism-and-lens array structure 53 into the prism portion of the structure, is reflected from a first mirror surface 55 toward a second mirror surface 57, is reflected from the second mirror surface 57 toward the lens portion of the structure 53, is collimated and then emitted through the curved top surface of a lens element 61. The emitted light 63 from lens elements 61 form a virtual reimaged array of source images 71 of the original array of light beams 51 which appears to come from below the prism-and-lens structure 53. The reimaged light 63 has an image array axis 64 which is substantially parallel to the original array axis 52, but the light propagates in a direction which in its preferred embodiment is substantially perpendicular to the propagation direction of the original beam array 51 and perpendicular to the array axes 52 and 64, i.e. in the transverse or vertical direction of the original array 51. Further, as seen in FIG. 9, the individual reimaged light elements 71 have been rotated about the array axis 64, so that in the case of a 90° rotation what corresponded to the lateral or horizontal dimensions of an original light source element 53 parallel to the direction of axis 52 now corresponds to the transverse or vertical dimension of the reimaged light element 71 perpendicular to the direction of axis 64, and what corresponded to the transverse or vertical dimension of the original light source 53 perpendicular to the direction of axis 52 now corresponds to the lateral or horizontal dimension of the reimaged light element 71 parallel to the direction of axis 64.

Figure 6:
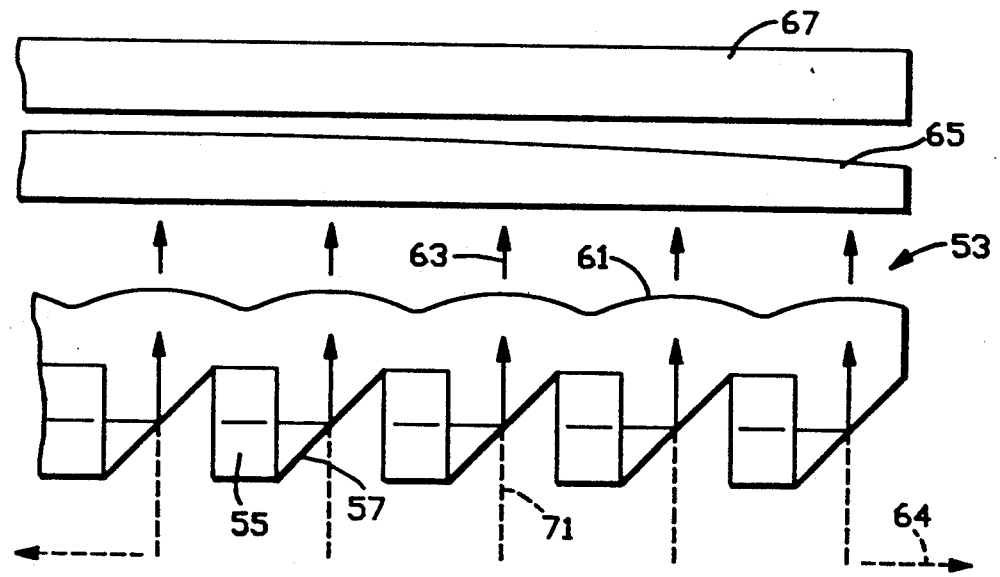
Figure 7:
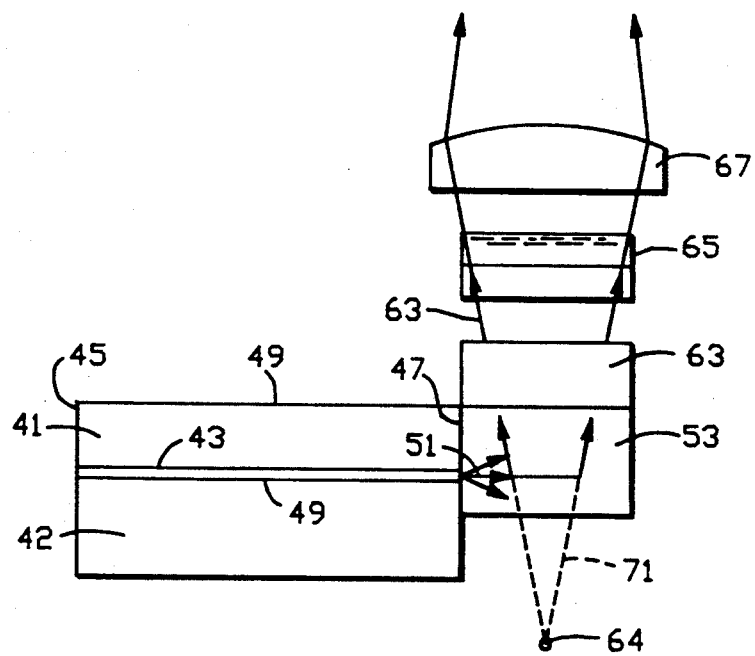
Figure 8A:
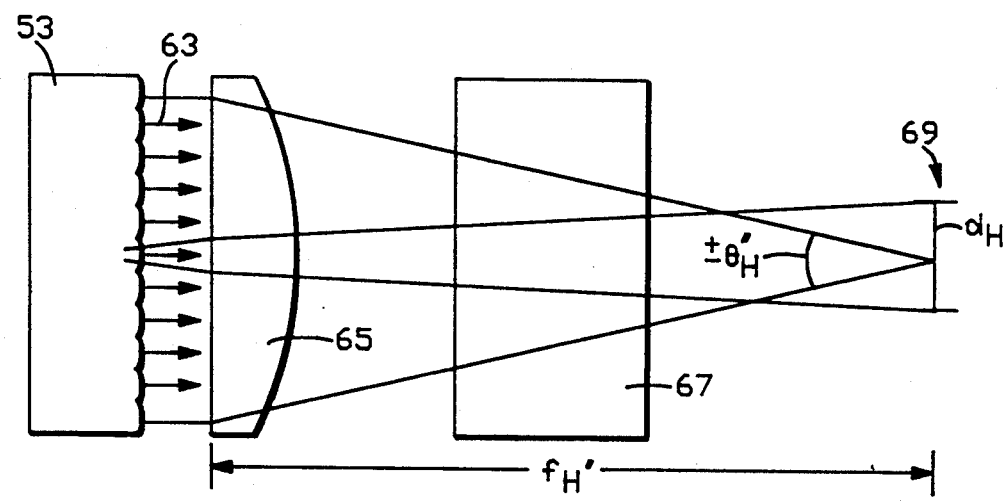
FIGS. 8A and 8B are respective schematic front and side views of the focussing optics used in the system of FIGS. 4–7.
Figure 8B:
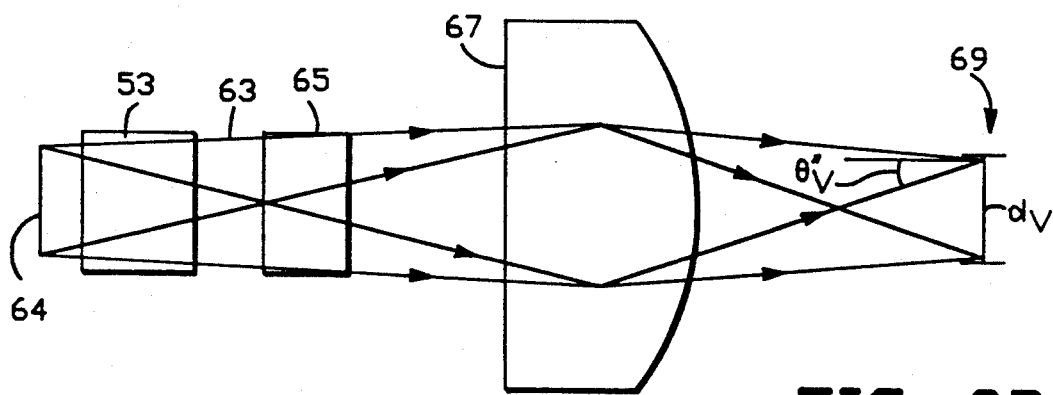

As seen in FIGS. 6 and 7, after having passed through the prism-and-lens array structure 53, the collimated light 63 emitted from the structure 53 may pass through brightness conserving focussing optics consisting of a pair of cylindrical lenses 65 and 67. For certain applications, low aberration, axially symmetric lenses with aspheric surfaces, or a combination of axial and cylinder lenses, or a single lens or some other lens system could also be used. Cylinder lenses most clearly present the concept of the lens system design, but because they cause aberrations, they are not always the best practical embodiment. As shown in FIGS. 8A and 8B, the pair of cylindrical lenses 65 and 67 focus the collimated light 63 to a spot 69 having lateral and transverse dimensions $d_H$ and $d_V$. Preferably, the dimensions are symmetrized so that $d_H \approx d_V$. Preferably, the lateral and transverse convergence angles $\theta_H''$ and $\theta_V''$ are also symmetrized so that $\theta_H'' \approx \theta_V''$. The rotation of sources by the prism-and-lens array structure 53 makes this possible.

Figure 9:
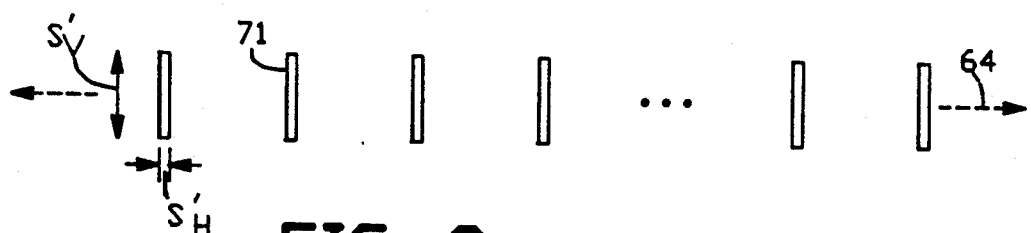
FIG. 9 is a schematic representation of the virtual image of the array of laser sources after having undergone a 90° rotational transformation by means of the system in FIGS. 4–7.
Figure 10:
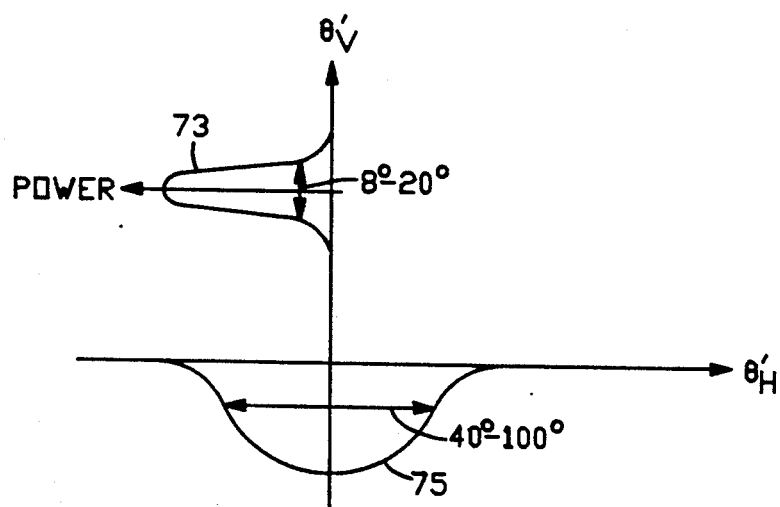
FIG. 10 is a pair of graphs of optical power versus respective transformed transverse and lateral divergence angles $\theta_V'$ and $\theta_H'$ illustrating the divergence profile of each source image of the reimaged array in FIG. 9.

Referring to FIGS. 9 and 10, the source images 71 in the reimaged array are still collinear and laterally spaced apart and the reimaged array has an array axis 64 that passes through each of the source images 71. As already noted, the image array axis 64 is parallel to the actual array axis 52 seen in FIG. 5. Each source image 71 has been rotated on the array axis 64 so that the lateral and transverse size dimensions $S_H$ and $S_V$ and divergence angles $\theta_H$ and $\theta_V$ have undergone a rotational transformation. In particular, each source image 71 is characterized by a transformed lateral size dimension $S_H'$ and a transverse size dimension $S_V'$. In the preferred case of a complete 90° rotation, $S_H' = S_V$ and $S_V' = S_H'$. The roles of the lateral and transverse size dimensions have switched places between the actual array of sources 53 and the reimaged array of source images 71. As seen in FIG. 9, the divergence components have also undergone a rotational transformation. Each source image 71 is characterized by transformed transverse and lateral divergence profiles 73 and 75, with a full width spread in the transverse divergence angle $\theta_V' = \theta_H$, that is, $2 \cdot \theta_V' \approx 8°$ to 20° for a 90° rotation, and a full width spread in the lateral divergence angle $\theta_H' = \theta_V$, that is, $2 \cdot \theta_H' \approx 40°$ to 100° (measured to include 95% of the optical power). Thus, the roles of the lateral and transverse divergence angles have also switched places between the actual and reimaged arrays. The brightness is not reduced by this transformation and can be characterized by a lateral component of brightness for the image $B_H'$ that is proportional to $(N \times S_H' \sin \theta_H')^{-1}$ and by a transverse component of brightness for the image $B_V'$ that is proportional to $(S_V' \sin \theta_V')^{-1}$. For a 90° rotational transformation, the brightness in each dimension is proportional to the following:

$$B_H' \propto (N \times S_H' \sin \theta_H')^{-1}$$
$$\propto (N \times S_V \sin \theta_V)^{-1}$$
$$B_V' \propto (S_V' \sin \theta_V')^{-1}$$
$$\propto (S_H \sin \theta_H)^{-1}$$

The intrinsic asymmetry ratio for the reimaged array $A'$ is reduced so as to be closer to, or preferably equal to, unity. $A' = B_V'/B_H' = (N \times S_V \sin \theta_V)/(S_H \sin \theta_H) = N^2 \times A^{-1}$. For a typical laser array of N equals twenty 50 μm × 1 μm, 10° × 50° divergence sources, the asymmetry has been reduced from $A = 227$ to $A' = 1.76$.

In actual practice, the characteristics of a laser array to be manufactured can be adjusted so that $A' = 1$ upon being reimaged by a prism-and-lens array structure. In particular, the number of sources N and the lateral dimension of each source $S_H$ are both adjustable. From the equation given above for $A'$, we see that $A = N^2$ must be satisfied for $A' = 1$. This occurs when $N = S_H \sin \theta_H / S_V \sin \theta_V$, so that the relationship between N and $S_H$ can be adjusted until this latter condition is satisfied.

Figure 11:
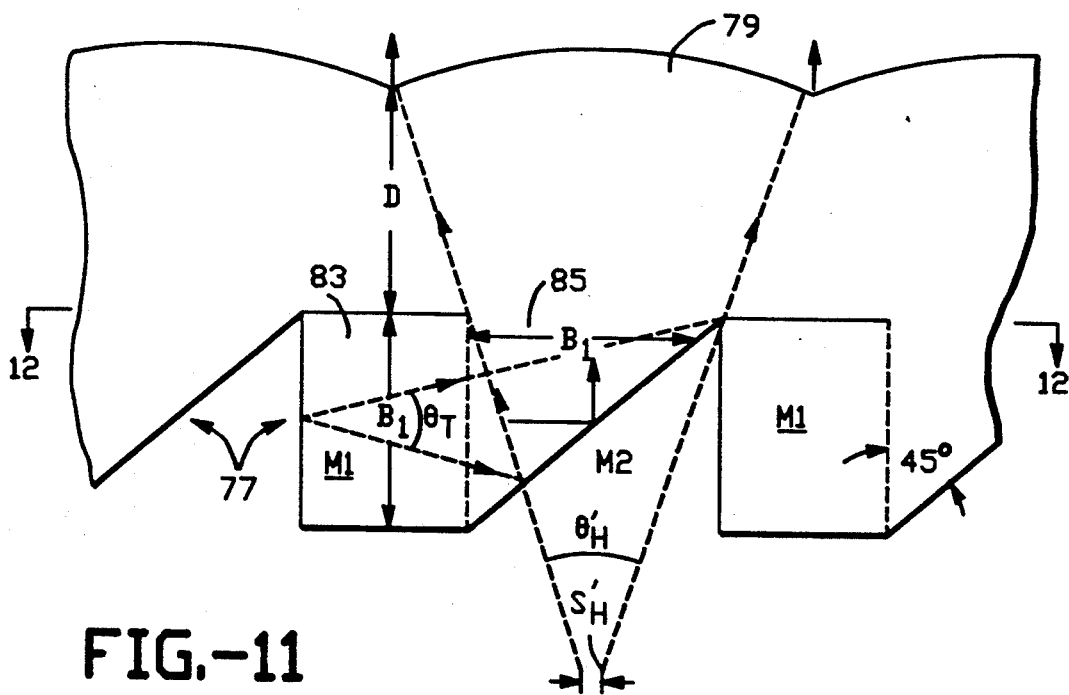
FIGS. 11–13 are respective front plan, sectional and perspective views of an array of prism structures with microlens array for use in the system of FIGS. 4–7. The section in FIG. 12 is taken along the line 12—12 shown in FIGS. 11 and 13.
Figure 12:
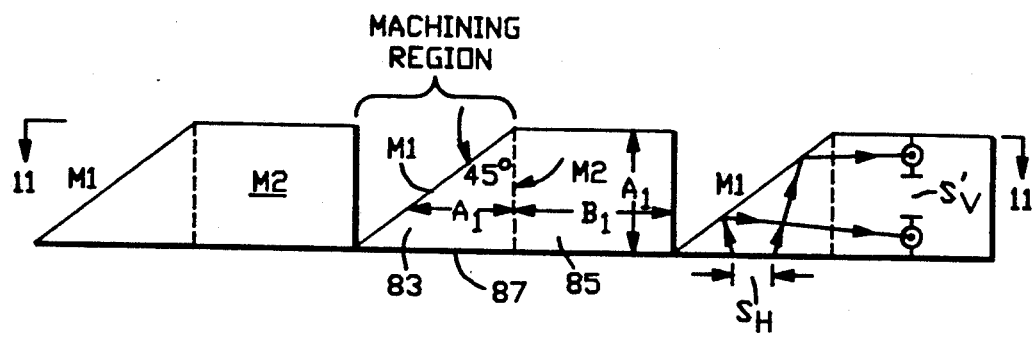
Figure 13:
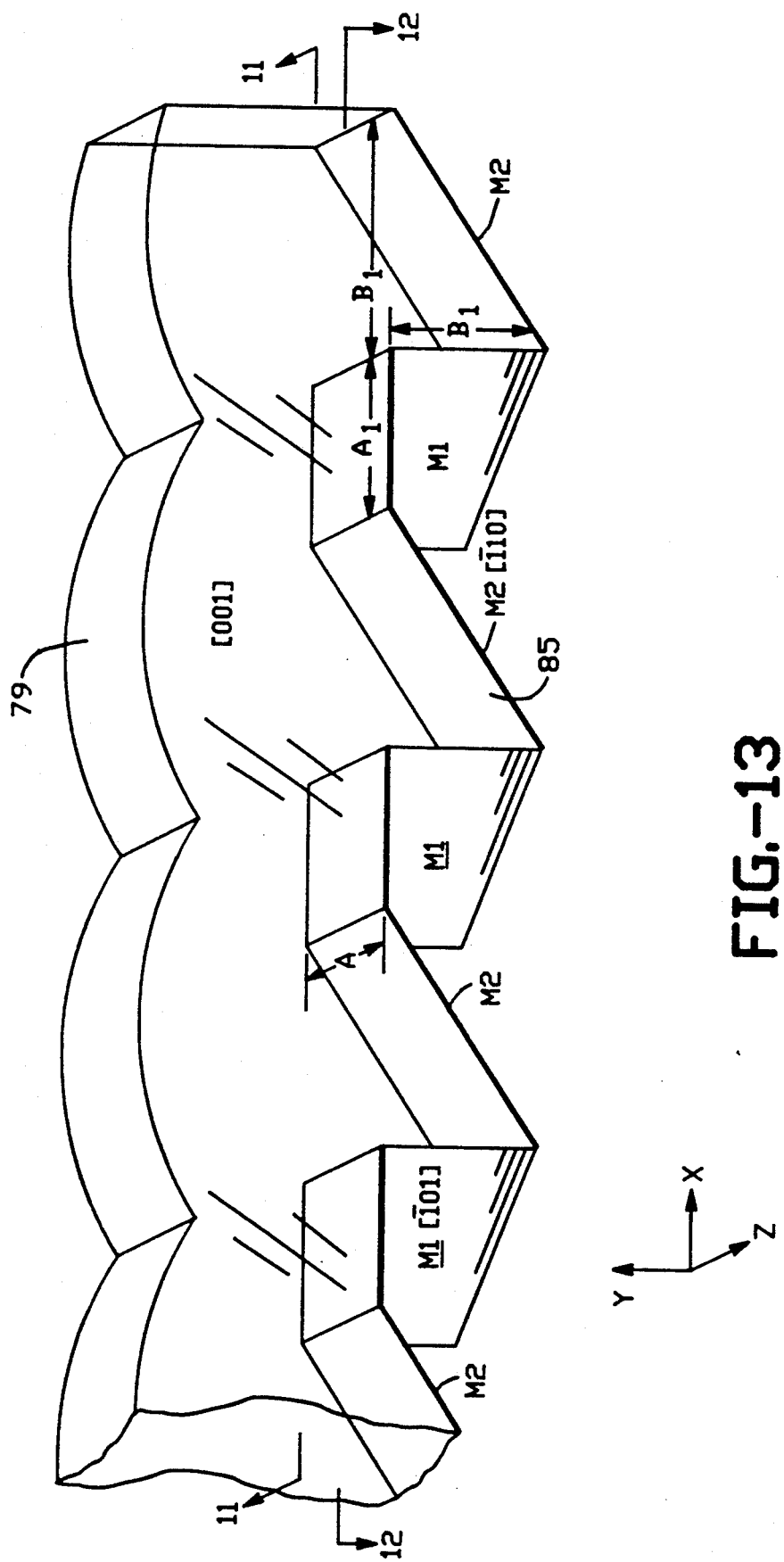

With reference to FIGS. 11-13, the prism-and-lens array structure has an array of multiple reflector elements 77, each formed from a pair of prisms 85 and 83, and an array of microlenses or lenslets 79. Mirrors may also be used in place of the prisms. If we define a Z-axis to be in the longitudinal direction of light propagation for light emitted by each laser source from a facet of an array of such sources, then the light admitting surface 87 of the first prism 83 should be oriented in a [001] plane, i.e., with its normal ray parallel to the Z-axis. We define an X-axis to be in the lateral direction parallel to the array axis 52 of the laser array, seen in FIG. 5, and a Y-axis in the transverse direction perpendicular to both the X- and Z-axes. Then, if the first prism 83 has a first mirror surface M1 in the [101] or [$\bar{1}$01] plane, the mirror M1 will be oriented at 45° with respect to the admitted light, so that the admitted (0,0,1) directed light will be reflected into the (−1,0,0) or (1,0,0) direction. If the abutting second prism 85 to one side of first prism 83 has a second mirror surface M2 in the [110] or [$\bar{1}$10] plane, that mirror M2 will be oriented at 45° with respect to the once reflected light, so that this reflected light will again be reflected into the (0,1,0) or (0,−1,0) direction. Lenslets 79 are positioned in the path of the now twice reflected light.

While 45° mirror orientations are preferred, other orientations are also possible, although not all orientations will produce a complete 90° rotational transformation of each source in the resulting image, nor all produce an output directed in the Y-axis. It is sufficient that the first mirror M1 have at least both X- and Z-components, not necessarily equal and not necessarily excluding a possible Y-component as well, for the once directed light to have a lateral component of light propagation. It is also sufficient that the second mirror M2 have at least both X- and Y- components, not necessarily equal and not necessarily excluding a possible Z-component as well, for the twice reflected light to have a transverse component of light propagation. Such a combination of mirrors will produce a rotational transformation of the source images with respect to the imaged array axis.

The actual design of a brightness conserving, asymmetry reducing optical system will in general require compromise between the optical power required, tolerances attainable, and micro-optics available. However, the basic approach by which full brightness conservation along with minimization of asymmetry is attained is well defined.

In general, a practical application for the invention will exist wherever a linear array is power limited by thermal dissipation which in turn limits the obtainable fill factor or region of active laser emission to a certain percent. As an example, a 1 cm bar may not be capable of thermally dissipating more than that power that results from emission of approximately 6 watts of optical power. For typical high brightness diodes, this corresponds to an approximately 1/16 fill factor and a 630 $\mu$m lateral aperture to achieve the entire 6 watt output.

As a typical example, this laser structure may have a 1.5 $\mu$m aperture width and $\pm 30°$ divergence in the transverse dimension. Lateral divergence may be $\pm 10°$. For this bar, intrinsic asymmetry A is given by $$A = \frac{630 \ \mu m \sin (10°)}{1.5 \ \mu m \sin (30°)} = 145$$

For this example, the source is exactly symmetrized by breaking the 630 $\mu$m source into N separate diodes where $$N = A^{\frac{1}{2}} = 12$$

Thus the optimized optic design for this 1 cm bar consists of:

$N = Diode \ \# = 12$ $S_H =$ Diode lateral dimension $= 52 \ \mu$m $A_1 + B_1 =$ Lenslet pitch $= 833 \ \mu$m $N.A._L =$ Lenslet numerical aperture $= 0.5$ [0.87 lens F#]

This calculation totally defines the lenslet design, pitch, and diode source size. The only remaining parameter to be defined is the lens width $A_1$. $A_1$ can be calculated from the need to fully capture the source lateral divergence, $2 \theta_H$. If one assumes a refractive index $n = 1.75$, then the divergence within the prism glass may be calculated:

1.75 $\sin \theta_{H,PR} = \sin (10°) \rightarrow \theta_{H,PR} = 5.7°$
1.75 $\sin \theta_{V,PR} = \sin (10°) \rightarrow \theta_{V,PR} = 16.6°$ The focal length, L, within the glass structure is the distance over which the transverse divergence, $2 \theta_{V,PR} = 33.2°$, spreads to the full lenslet width of 833 $\mu$m;

$\tan (16.6°) = 417 \ \mu m / L$

L = 1.394 mm [within 1.75 index material]

Over the same distance, the beam lateral divergence, $2 \theta_{H,PR} = 11.4°$, will spread to lens width $A_1$;

$$\frac{\delta/2}{L} = \tan (5.7°)$$

$\delta = 278 \ \mu$m
$A_1 = 52 \ \mu$m $+ 278 \ \mu$m $= 330 \ \mu$m

In order to minimize beam clipping, the prism width $(A_1 + B_1)$ should be allowed to fill the full lens pitch $A_1 + B_1 = 833 \ \mu$m $B_1 = 503 \ \mu$m This totally defines the lens in the example in which the intrinsic asymmetry has been purposely reduced to 1.0.

As a practical matter, increased power per bar and consequently increased fill factor F can be shown to increase the diode number as $F^{\frac{1}{2}}$. Accordingly, a greater fill factor means more diodes, and thus a smaller pitch and less "dead space" between diodes into which to fit the prisms. Meanwhile, a greater fill factor also means wider diode width. Eventually, the bar fill factor grows to where the available space and diode width causes beam clipping within the prisms. Also, prism sizes can become impracticably small for this "optimized brightness" case.

Beam clipping, following the above design algorithm, always occurs only for the transverse divergence. The prism is specifically designed to accommodate the lateral divergence by designing for "$A_1$" to encompass the lateral divergence. However, the dimension $B_1$ is fixed at a maximum of pitch minus $A_1$. For this design, the "pitch" $A_1 + B_1$, always equals the central beam path through the prisms to surface 11 where the prisms interface the microlens. At this surface, beam divergence must be less than the width $B_1$ otherwise clipping occurs. As the fill factor F increases, pitch decreases as $F^{\frac{1}{2}}$. But diode width increases as $F^{\frac{1}{2}}$, so the ratio of pitch to diode width decreases as $F^{-1}$. This means a larger fraction of the pitch is occupied by prism 83 instead of prism 85.

For the above example, the beam passing through surface 11 has half a width of:

833 $\mu$m $\tan (16.6°) = 248 \ \mu$m or a full width of 496 $\mu$m. This is slightly smaller than $B_1 = 503 \ \mu$m, and so no appreciable clipping occurs.

However, for a second example of twice the 1/16 fill factor (approximately $\frac{1}{8}$ fill factor), $N \simeq 17$ $S_H \simeq 74 \ \mu$m $PITCH = 588 \ \mu$m $= +A_1$ $L = 986 \ \mu$m $A_1 = 74 \ \mu$m $+ 197 \ \mu$m $= 271 \ \mu$m $B_1 = 317 \ \mu$m In this second example, the beam through surface 11 is $2 \times 588 \ \mu$m $\tan (16.6°) = 351 \ \mu$m, This is larger than the $B_1$ dimension of 317 $\mu$m, implying the onset of clipping.

These examples are cited to point out that even under ideal designs, full symmetrization in a brightness conserving manner can only be achieved below a certain laser fill factor. These examples also show that low divergence and low fill factor, both properties peculiar to very high brightness laser bar structures, are very valuable in aiding the design of these optics and in increasing the maximum fill factor.

In the embodiment described above, the fill factor of the bar, that is, the percentage of active emitting aperture, is ultimately limited by the size of the reflective mirror or prism structure for transforming the source image. The size of the reflective mirror or prism structure is, in turn, determined in large measure by the divergence of the source in both the lateral and transverse dimensions, and particularly by the large divergence in the transverse dimension. If the source were to have negligibly narrow divergence values, it can be seen that embodiments of this invention would exist that could tolerate fill factors approaching well over 50%. Where large fill factors are desired it will be shown in a later embodiment that the large source divergence in the transverse dimension can be transformed prior to entry into the reflective mirror or prism structure, so as to produce a source that is larger in its transverse dimension, but smaller in its transverse divergence, thus meeting the criteria for achieving substantially larger fill factor. Such an embodiment is a specific example of a general class of embodiments of this invention for which optical transformations of the source image may occur before the reflective mirror or prism structure, as well as after the reflective mirror or prism structure.

A clear and very important example of the utility of this invention lies in its ability to maximize laser coupling into a round fiber optic. As already noted, prior systems allow reformatting of a source into a square, which leaves a large divergence asymmetry, or reformatting the source into a symmetric divergence, which leaves a large source shape asymmetry. A circular fiber will then "mix" these asymmetries in a way that degrades brightness by 1 to 2 orders of magnitude. With the present invention, both size and divergence can attain square symmetry. While this does not match perfectly with a round fiber, the brightness degradation associated with mixing this square injected source into the round fiber is small compared to the prior art. This particular example of high brightness coupling to fibers has great utility, as it is key to both the combining of power through fiber bundling and the remoting of the light source through the flexibility of fibers.

It is useful to examine the prior example of a "symmetrized" beam consisting of twelve 52 μm sources, and the means by which this lensed linear source might be refocused into a fiber.

Figure 14:
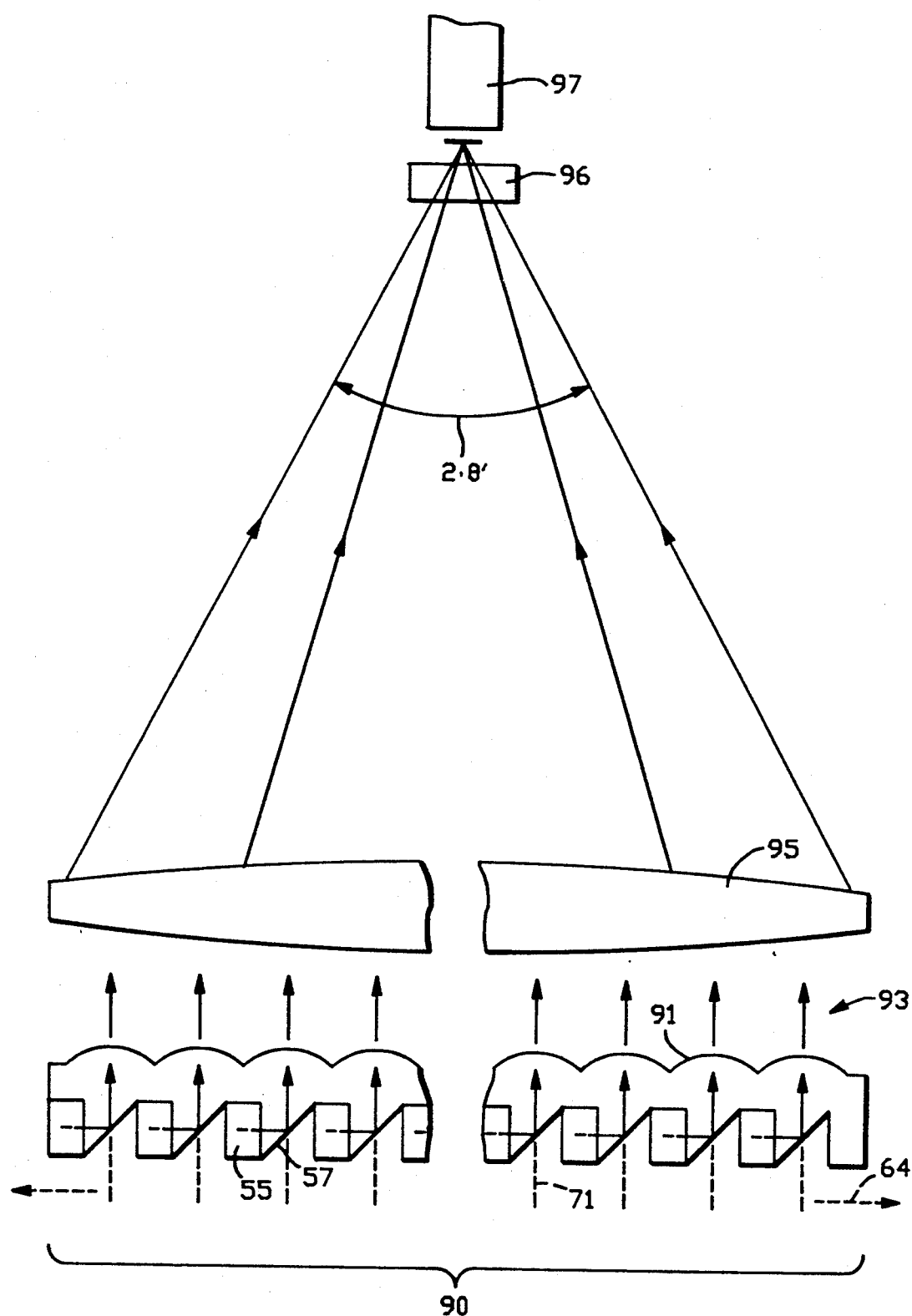
FIGS. 14 and 15 are respective front and side plan views of an alternative embodiment of a laser array system of the present invention.
Figure 15:
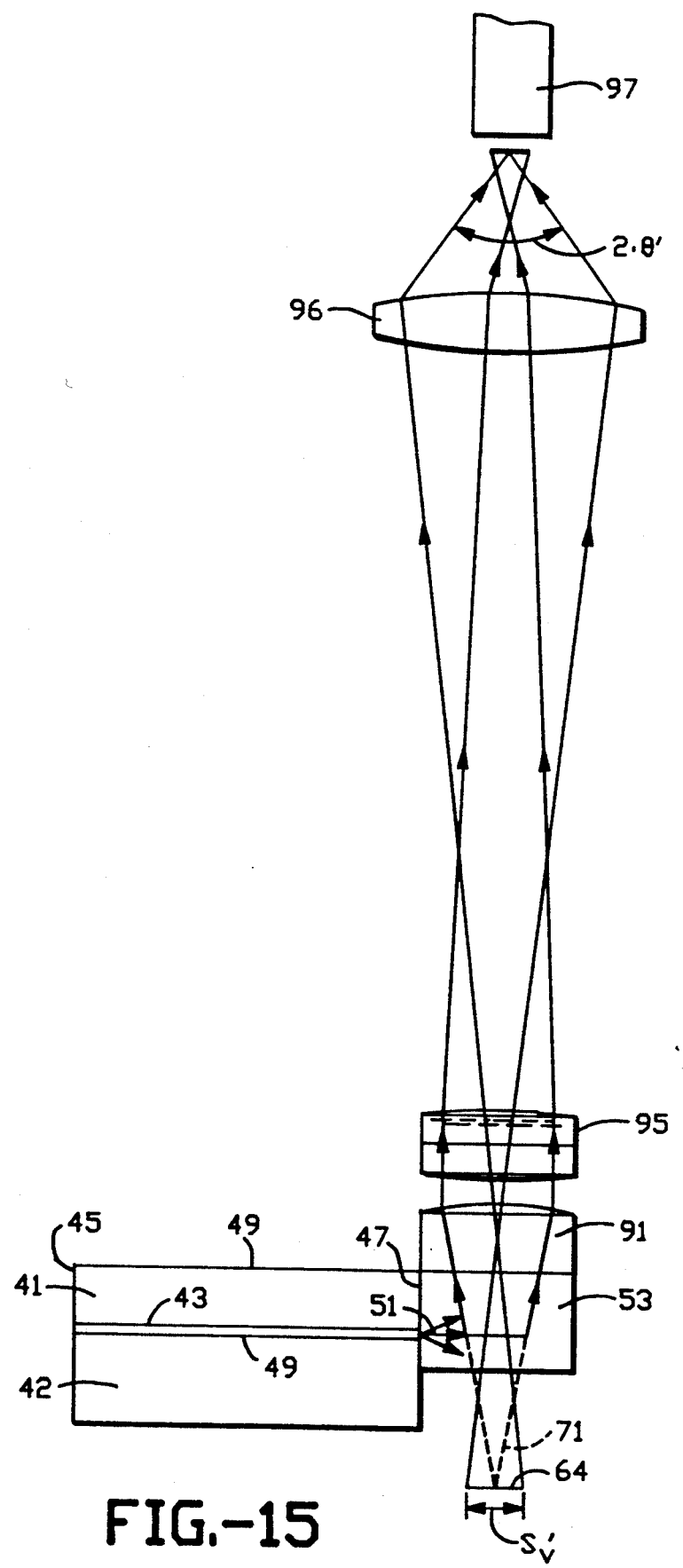

FIG. 14 shows a lensed line source of twelve sources 90 similar to that shown in FIG. 6. However, in this example, lenslet 91 is assumed to be a radially symmetric, aspheric rather than cylinder lenslet. The array 93 then consists of a line of aspheric lenses, each positioned at its focal length relative to the source. The reconvergent lens, 95 is also a radially symmetric, aspheric lens, rather than a cylinder lens. In this case, aspheric lenses replace cylinder lenses, because in geometries where the cylinder lens focal length is large relative to the source, that is, for highly collimating lenses, an inherent defect of such cylinder lenses causes a "bow tie" shape in the beam divergence that can substantially degrade the inherent source brightness. In FIGS. 14 and 15, the highly collimated portions of the design utilize aspheric (not cylindrical) optics. An asymmetric lens is still needed, however, to establish symmetry in both image size and divergence, and in this example, this is accomplished by a cylinder lens 96. In this example, the divergence spread of the beam at lens 96 can tolerate the added aberrations associated with a "bow tie" effect without substantially degrading brightness. The reimaged source appears directly in front of fiber 97.

Curvatures of all but the cylinder lens are exaggerated. As seen in FIG. 14, lenslets 91 serve to collimate the twelve light sources. Aspheric lens 95 converges the collimated sources to the desired numerical aperture into the fiber in the lateral dimension. In the transverse dimension, seen in FIG. 15, source divergence is much larger, as it projects the 52 μm source width rather than the 1.5 μm source width. The convergence of this transverse collimation by lens 95 produces a divergence into the fiber that is correspondingly much smaller and spot size correspondingly much larger than that produced in the lateral dimension. The size-divergence product, however, is constant in both dimensions and so the asymmetric cylinder lens 96 can be used to symmetrize the spot into the fiber.

In this embodiment, the prism lens 53 is as previously described:

Sources in 1 cm: 12
Pitch: 833 μm
Lenslet focal length: 1394 μm [in 1.75 index material]
725 μm [air equivalent]

|  | Source Size | Source Divergence |
|---|---|---|
| Post lenslets: | | |
| transverse | 256 μm | ±2.05° |
| lateral | 1 cm | ±0.059° |
| At 2.458 cm focal length, F:2.46 spherical lens: | | |
| transverse | 1760 μm | ±0.30° |
| lateral | 50.6 μm | ±11.5° |
| At image plane of the approximate 1.76 mm cylinder lens: | | |
| transverse | 45.2 μm | ±11.7° |
| lateral | 50.6 μm | ±11.5° |

This symmetric but square pattern has maximum angles and dimensions that are the root sum of the squares of the two dimensions:

Diameter: 67.8 μm
Divergence: ±16.2° [0.28 N.A.]

This implies that, ignoring optics losses, 6 watts of power can be injected into a 70 μm fiber with <0.3 N.A. This likewise implies the capability to integrate more than 1kW of optical power into a 1 mm diameter fiber with less than 0.3 N.A.

The example of FIGS. 14 and 15 shows that the invention may be used to couple into round fibers with symmetrized high brightness. Further it shows that the invention may be used with any number of combinations of standard lens systems involving standard aspheric lenses or a cylindric lenses or poro prism lenses. Lens designs vary depending on the application. The proper combinations of lenses can minimize the aberrations of asymmetrizing cylindric or poro prism lenses. However, the essential feature of the invention is that the array of symmetry rotating prisms and lenslets alter the relative source size—divergence product in each dimension of the original line source in such a way that makes symmetrizing the beam possible.

Many similar applications exist.

It should be stated that this invention can be used in ways in which turning prisms and lenses are used to improve symmetry without achieving perfect optimum symmetry, although designs which attempt to achieve perfect symmetry have been emphasized. Also note that each element in the arrays of lenses and prisms have been described as being identical. However, this is not a requirement. For example, geometries with turning mirrors or prisms having various angles associated with each element of the mirror or prism array so as to bring the spots to come to a focus without the final lens could also be configured.

The prisms, microlens arrays that form the basis for the invention are typically very small, with dimensions on the order of 1 mm or less. Individual lenses and prisms can be assembled using precision alignment techniques. Lenses and prisms in the size range of interest are now made by many different companies. The more economic, and, in the long term, more viable lens manufacture technique for high volume manufacture of these lenslet/prism arrays is through precision molded optics. Plastic lenses have marginal thermal properties for most applications but glass molding technology has evolved to where such shapes and dimensional tolerances can be met. The lenslet array and the prism array can be made as a single unit, or alternatively, a lenslet array and a prism array could be made separately and then bonded together, provided registration between the array was acceptable.

Figure 16:
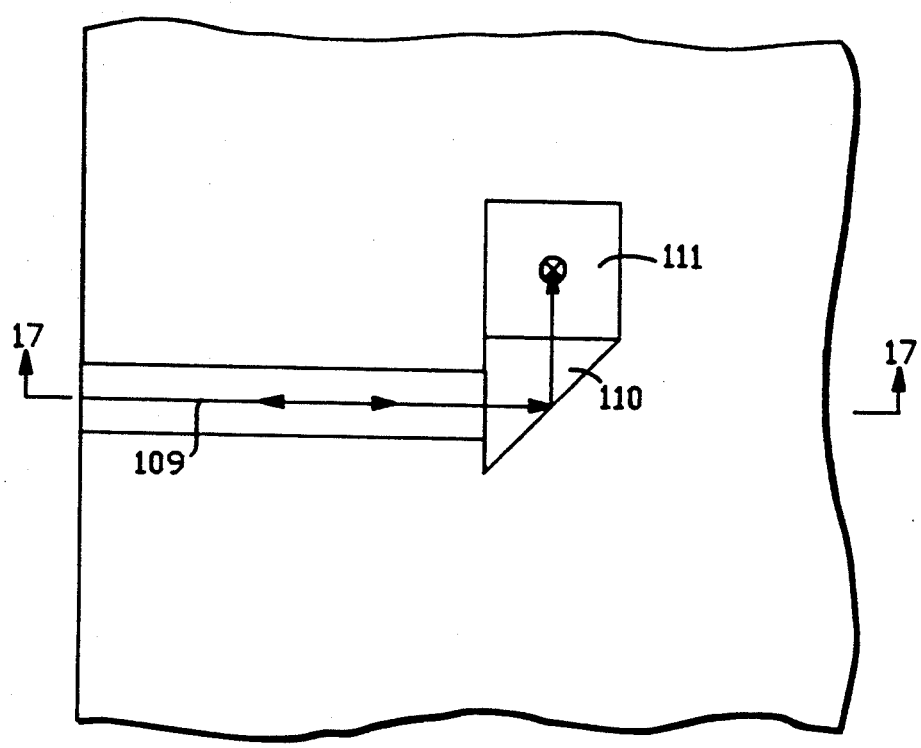
FIGS. 16 and 17 are respective top and side plan views of a third embodiment of a laser array system of the present invention with integral laser and reflective elements.
Figure 17:
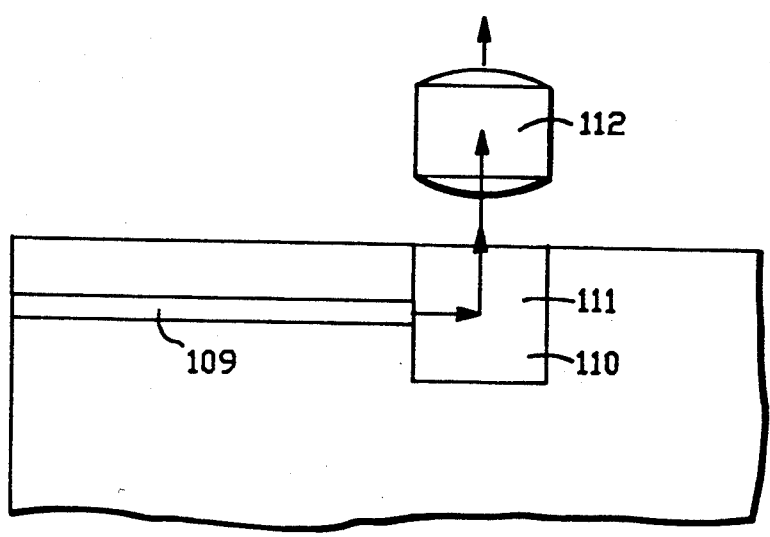

A different type of embodiment of this invention is shown in FIGS. 16 and 17. This figure represents a "micro-embodiment" of the invention in which the invention is built into a monolithic GaAs structure. The laser cavity 109 has its mirrored ends ion milled into the GaAs layer structure and substrate. The same technique is used for the first turning mirror 110 and a more complex technique is used to "mill" a second mirror 111 that is "ramped" into the GaAs. A microlens 112, like the prisms, is part of an array. Various advantages are associated with this embodiment. Its main characteristic is that a very fine pitch in prisms and lenses is possible. Several advantages follow from this. A large number "N" of individual lenslets is possible. This means symmetry can be achieved even for a high percentage of emitting source from the linear laser source. The small sizes also eliminate the adverse "bow tie" aberrations in cylinder lenses. For light with divergence of ±30° by ± 7.5°, a cylinder lens collimating the ±30° will have no significant "bow tie" aberrations for cylindrical sizes below around 200 $\mu$m and typical (about 1.5 $\mu$m) source sizes. The small lens sizes involved also make these structures compatible with recently developed photolithographic/mass transport methods for making highly accurate and registered lenslet arrays.

Other embodiments of this invention relate to the means in which it may be used. It is known in the literature that laser diodes may be combined in a way that enhances brightness by using polarization sensitive mirrors to combine light beams from two different laser diodes. This exploits the extreme polarization found in the light emitted from semiconductor laser diodes. In like manner, laser diodes have very narrow spectral emission. This can be exploited by using dichroic mirrors to combine emission from one or more laser diodes. Since the present invention retains the high level of polarization of the semiconductor laser bar as well as its narrow spectral linewidth, it is possible to combine symmetrized beams through polarization combining or spectral combining just as it is true of individual diodes. In fact, if such combining is done with symmetrized beams, the combining optics can be simplified.

Figure 18:
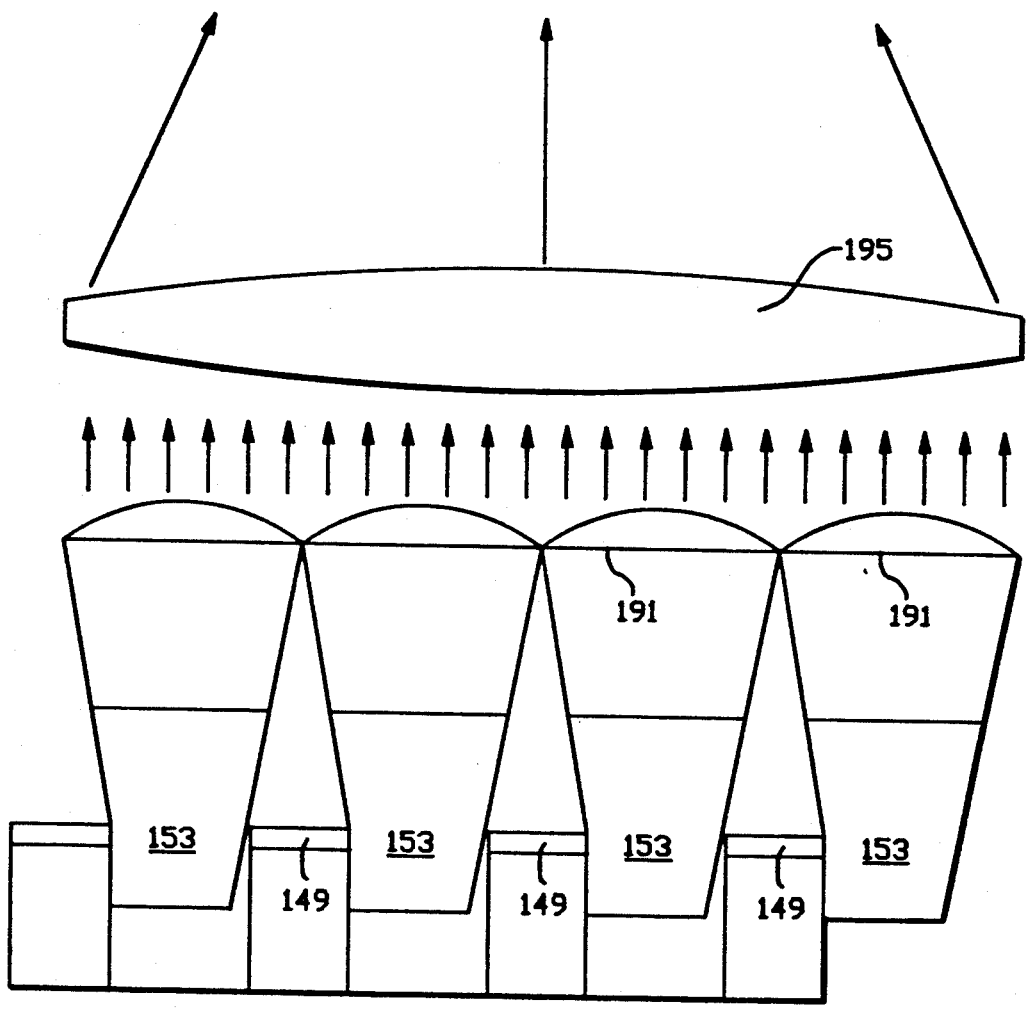
FIG. 18 is a side view of multiple laser array systems, each like that shown in FIGS. 4–7, which are placed together to form a larger optical system.

Yet another embodiment of this invention relates to extending this design from a one dimensional array of sources to a two dimensional array. FIG. 18, in analogy with FIG. 15, shows how properly dimensioned and spaced laser diode arrays may be mounted in lines of sources in two dimensions. Each source 149 passes through a turning prism 153 and beam filling optics 191. Several linear arrays of such sources exist and so a single reconvergent lens 195 can be used to refocus the light from this two dimensional array of sources. Proper spacing and source size can be used to insure a particular symmetry in the final beam, as previously discussed. Other embodiments are also possible.

As yet another embodiment, it was noted earlier that optical lenses may be used before the reflective mirror or prism structure, as well as after the reflective mirror or prism structure. In particular, it was noted that optical lenses may be used to reduce the large transverse divergence of the source before the light enters the reflective mirror or prism structure, thus reducing the required physical size of said reflective mirror or prism structure, and thus allowing a higher bar fill factor.

FIGS. 19-23 show such an embodiment. Total fill factor on a 1 cm bar is desired to be approximately 50% or 5,000 $\mu$m. Typically, lateral divergence for such a bar is ±7°, transverse size is 1.5 $\mu$m, and transverse divergence is ±30°. As previously described, the symmetry of this source can be optimized by choosing a source number N which satisfies the equation:

$$N^2 = \frac{(5,000 \ \mu m) \times \sin(7°)}{1.5 \ \mu m \times \sin(30°)}$$

which yields:

N≈30;

source size≈$\mu$m; and source spacing≈330 $\mu$m.

Figure 19:
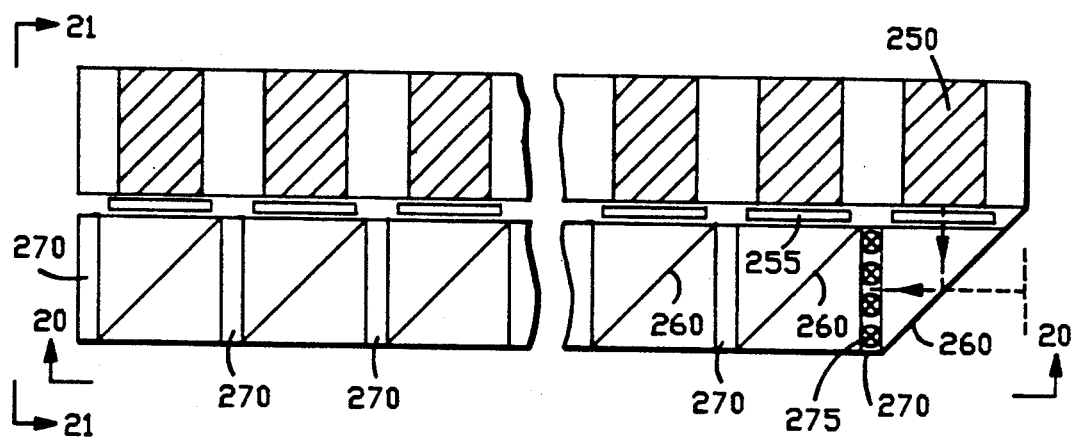
FIGS. 19-21 are respective top plan, system front end and side views of a fourth embodiment of a laser array system of the present invention featuring a set of lenses for focusing light from a laser bar prior to transformation by a reflector or prism array structure.
Figure 20:
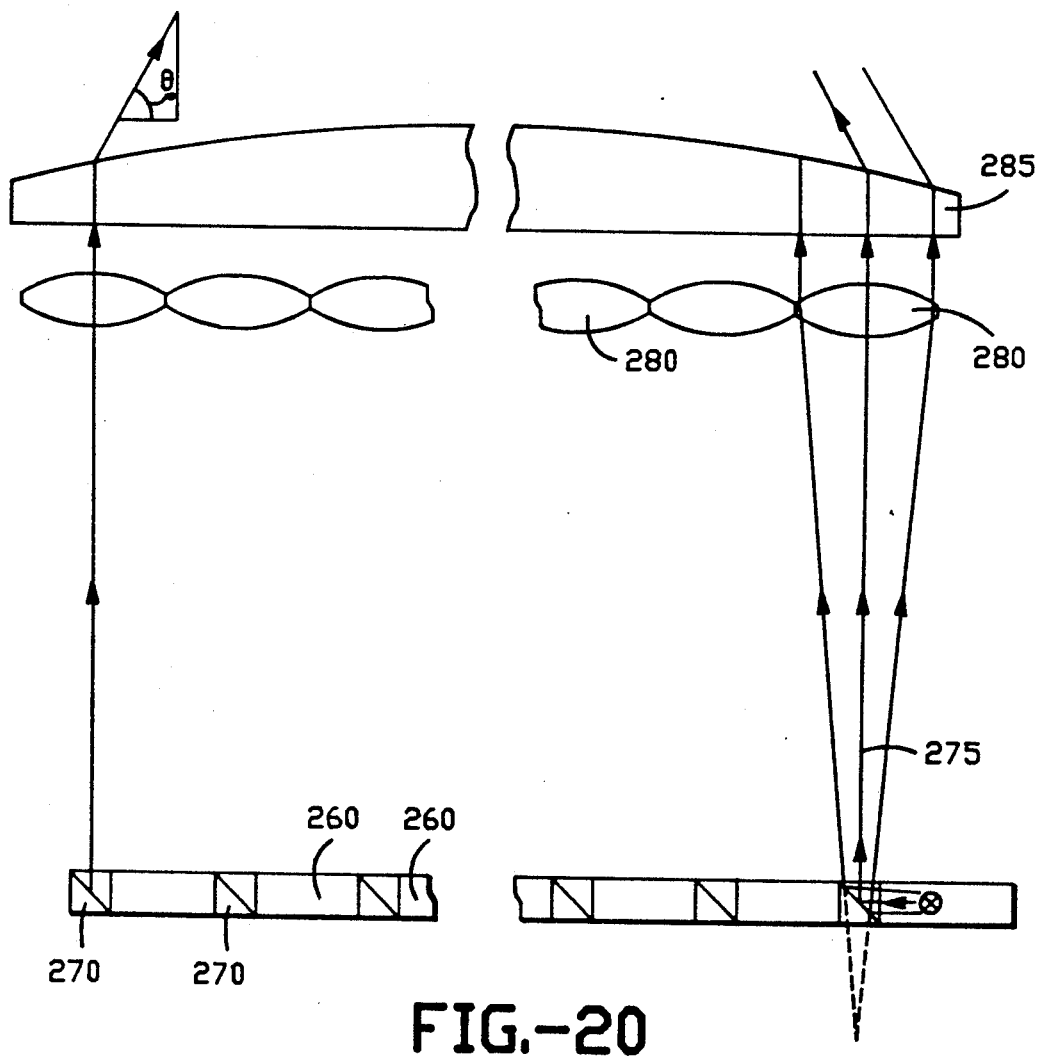
Figure 21:
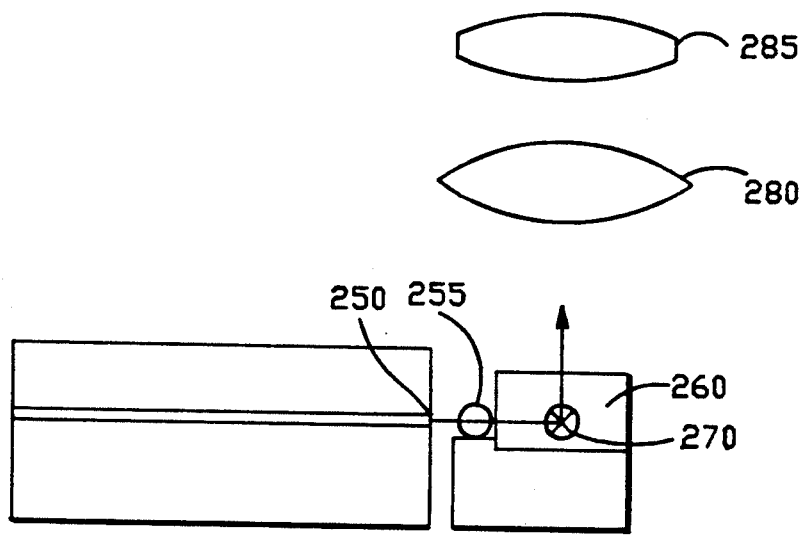

In the embodiment of FIGS. 19-23, the large transverse divergence is significantly reduced with a lens, preferably a cylinder lens 255, seen in FIGS. 19 and 21. The lens is approximately 25 $\mu$m in diameter. This lens collimates the initial source to transform it from a source of size 1.5 $\mu$m and divergence ±30° to a source of size 20 $\mu$m and a divergence of approximately ±2.3°. This transformed source then has sufficiently low divergence that it takes a minimum of space as it expands through the reflective mirror or prism structure, consisting of first reflective surfaces 260 and second reflective surfaces 270, emanating in rays 275 and directed toward beam filling optics 280. Through this pre-lensing, the beam width as it exits a second reflective surface 270 is only approximately 50 $\mu$m, so that the total size of the reflective mirror or prism structure may be kept at less than 330 $\mu$m, thereby ensuring 50% fill factor.

The remaining optical design in this embodiment is very similar to that previously described. Each of the thirty beams from the thirty second reflective surfaces 270 spread to a beam filling microlens array 280, seen in FIGS. 20-23. The microlens array 280 preferably consists of radially symmetric lenslets positioned at their focal length relative to the source virtual image and also positioned at the point where adjacent beams just begin to intersect, so as to provide beam filling and collimation for this embodiment. The microlenses have high F-number to capture ±2.3° light with approximately 4200 $\mu$m focal length. Following collimation by array 280, the beam is refocused by an axially symmetric lens 285. This lens may be either spherical or aspheric, depending on cost and performance tradeoffs. Ideally, the lens reimages the beam in both dimensions, although the inherent source size asymmetry would be preserved using only this single axial lens.

Figure 22:
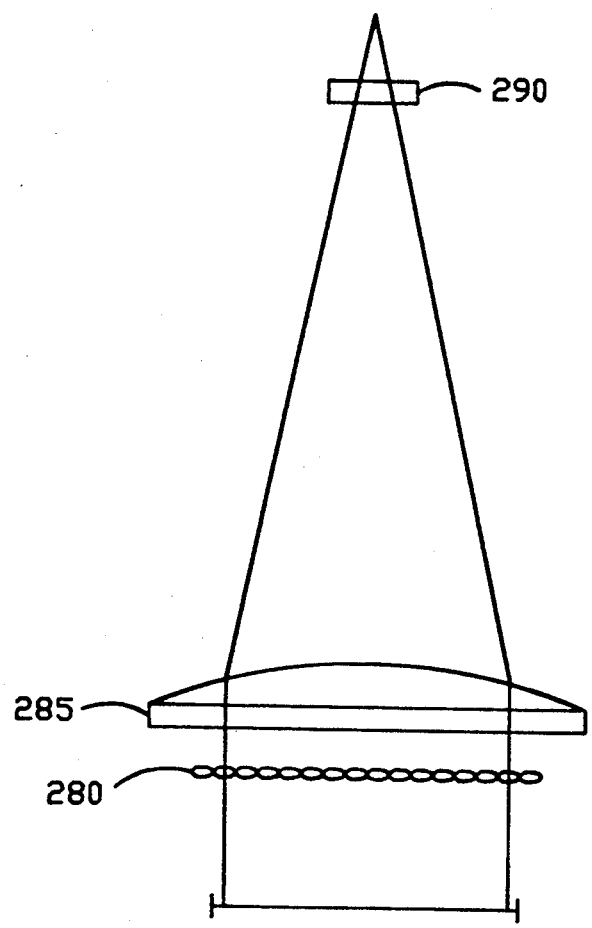
FIGS. 22 and 23 are respective reduced front end and side views corresponding to FIGS. 20 and 21 illustrating light paths through focusing optics subsequent to transformation.
Figure 23:
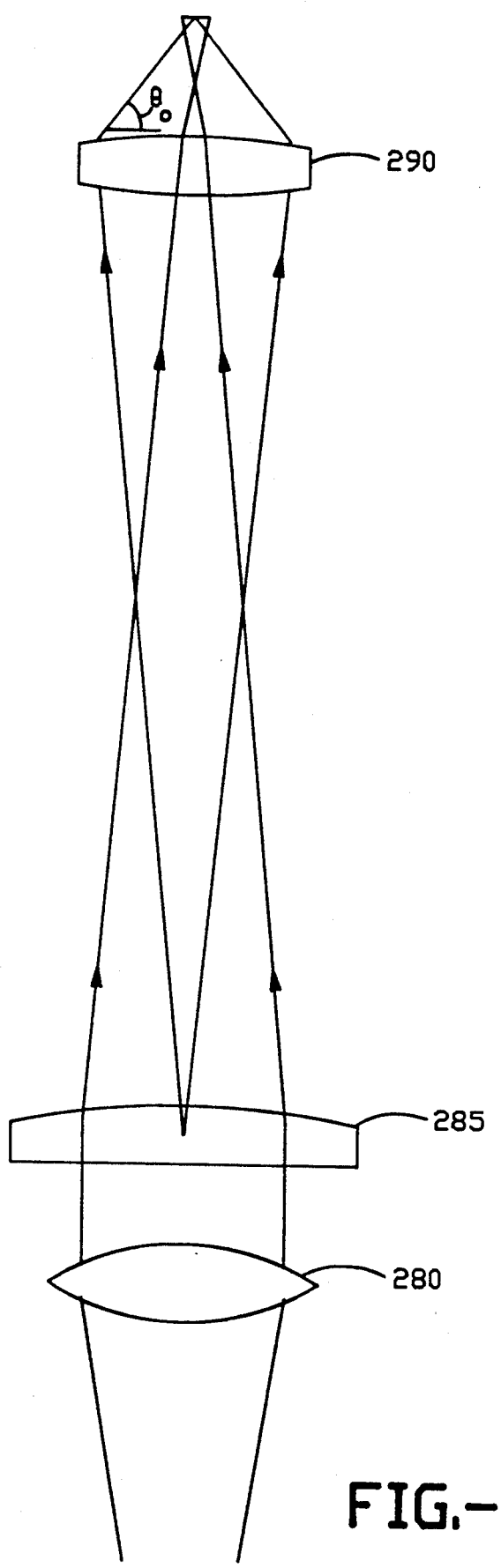

As previously described, beam symmetry is restored in both size and divergence with a second asymmetric cylinder lens 290 that reimages in only the lateral dimension, as shown in FIGS. 22 and 23. Lens 285 in the embodiment shown is an F:3.0 lens, reducing the transverse beam to approximately 70 $\mu$m width, with a 0.16 beam N.A. With an appropriate cylinder lens 290, of similar, although not exactly the same, F-number, and approximately 0.6 mm width, similar convergence to 70 $\mu$m width and 0.16 N.A. can be attained in the second dimension. This symmetrized spot can then be captured by an optical fiber waveguide of 100 $\mu$m diameter and about 0.23 N.A. It is possible to achieve average power in excess of 40 Watts from a 1 cm bar with 50% fill factor, implying the possibility of power densities of up to 500 Kw/cm$^2$ utilizing this design. Furthermore, this embodiment is wholly compatible with photolithographic means for reflective mirror and microlens array manufacture, owing to the very fine dimensions made possible by the collimation of the beam prior to its entry into the reflective mirror or prism structure.

In all of the embodiments described, the basic invention is an array of turning prisms or mirrors in combination with an array of microlenses and asymmetric optics whose purpose, is to change the transverse as compared to lateral source size—divergence products or inverse brightness, and to reformat these products in an arbitrary way. The present invention is able to symmetrize both source dimensions and divergences because the rotational transformation provided by the prism-and-lens array structure reduces the intrinsic asymmetry A to near unity if desired, so that simple optics are all that is required for the symmetrization. Brightness is conserved in the process, both because the prism-and-lens structure is able to transmit all or nearly all of the admitted light to the lens array output and because only simple lenses are needed for the subsequent spot formation.

I claim:

1. An optical system comprising,
multiple light sources arranged to form an array, said array defining a longitudinal direction parallel to a principal direction of propagation of light emitted from said sources, a lateral direction along an array axis passing through a line of said light sources and a transverse direction perpendicular to both said lateral and longitudinal directions, each of said sources emitting light that is characterized by a lateral and transverse light emitting dimension, and
multiple reflective elements arranged in front of said sources to form a corresponding array, said reflective elements positioned and oriented relative to one another and to said sources so as to cause a rotational transformation of light emitted from each source, said transformation being of such a nature that at least a component of said lateral and transverse dimensions of light emitted form each source is transposed into the other of said transverse and lateral dimensions of light emitted from that source.

2. The optical system of claim 1 wherein said multiple light sources are arranged in a linear array of sources.

3. The optical system of claim 2 wherein said sources are equally spaced along a line.

4. The optical system of claim 1 wherein said multiple light sources are arranged in a two-dimensional array of sources.

5. The optical system of claim 4 wherein said sources are equally spaced along multiple lines of sources with said lines of sources being equally spaced apart in a second dimension.

6. The optical system of claim 1 wherein said multiple light sources are semiconductor lasers.

7. The optical system of claim 6 wherein said multiple reflective elements are formed in a single monolithic laser crystal that provides said semiconductor lasers, said multiple reflective elements being accurately positioned in front of said semiconductor lasers.

8. The optical system of claim 1 wherein said rotational transformation of light emitted from each source by said multiple reflective elements is substantially 90° relative to an original orientation of said sources with respect to said array of sources such that a source divergence originally parallel to an axis of said array of sources becomes a divergence perpendicular to that array axis.

9. The optical system of claim 1 further comprising means for collimating light form said sources.

10. The optical system of claim 1 further comprising means for collimating light from said transformed light.

11. The optical system of claim 10 wherein said collimating means comprises a lenslet array, each lenslet positioned in front of a reflective element to receive transformed light from an individual source.

12. The optical system of claim 11 further comprising a lens for imaging the light collimated by said lenslet array.

13. The optical system of claim 1 further comprising means for focusing light from said multiple light sources prior to said rotational transformation by said multiple reflective elements.

14. The optical system of claim 13 further comprising means for reimaging light from said transformed light.

15. The optical system of claim 13 wherein said focusing means comprises a cylinder lens positioned between said multiple light sources and said multiple reflective elements and focusing a line of light sources in said transverse dimension only.

16. The optical system of claim 1 further comprising means for reimaging light from said transformed light.

17. The optical system of claim 16 wherein said reimaging means comprises a lenslet array.

18. The optical system of claim 16 wherein said reimaging means comprises a single lens.

19. The optical system of claim 16 further comprising means for at least partially collimating light from said sources in at least one dimension prior to said rotational transformation.

20. The optical system of claim 19 wherein said collimating means comprises a lenslet array disposed between said multiple light sources and said multiple reflective elements, said collimation occurring in both said lateral and transverse dimensions.

21. The optical system of claim 1 further comprising optical focusing means for reimaging light from said sources prior to said rotational transformation.

22. The optical system of claim 1 wherein said multiple light sources are arranged in an array of similar sources that are equally spaced along at least one line of sources, wherein said rotational transformation of light from each source by said multiple reflective elements is substantially 90° relative to an original orientation of said sources with respect to said array of sources.

23. The optical system of claim 1 further comprising means for providing a collimated beam from transformed light corresponding to said multiple light sources, said means for providing a collimated beam being positioned relative to said multiple light sources so as to allow the light emitted from said multiple sources to diverge to completely fill the space between transformed light from adjacent sources.

24. The optical system of claim 23 wherein said means for providing a collimated beam includes a lenslet array, each lenslet of said lenslet array positioned in front of a corresponding reflective element at a distance where diverging light emitted from each source intersects and begins to overlap light emitted from adjacent lines of sources, the light thereby substantially filling each lenslet of said lenslet array, said lenslets having a focal length substantially equal to the optical path length from the individual sources thereto, whereby the light is fully collimated by said lenslets.

25. The optical system of claim 1 wherein each light source is separately modulated.

26. The optical system of claim 1 wherein each light source emits light of a different wavelength.

27. An optical system comprising
an extended semiconductor laser source, said extended source defining a lateral direction along a principal direction of extension of said source and a transverse direction perpendicular to said lateral direction and also perpendicular to a principal direction of propagation of light emitted from said extended source, said source emitting light characterized by a lateral and transverse light emitting dimension, and
multiple reflective elements arranged in front of said source to form an array, said reflective elements positioned and oriented relative to one another and to said source so as to cause a rotational transformation of light emitted from segments of said source.

28. The optical system of claim 27 wherein said extended semiconductor laser source is composed of multiple laser sources arranged in an array.

29. An optical system comprising,
multiple light sources arranged in an array of similar sources that are equally spaced along at last one line of sources, any lines of sources in addition to one being equally spaced from one another in a second dimension, said array defining a lateral direction parallel to said at least one line of sources and a transverse direction corresponding to said second dimension perpendicular to said lateral direction and also perpendicular to a principal direction of propagation of light emitted from said sources, each of said light sources in said array emitting light characterized by lateral and transverse source size and divergence dimensions,
multiple reflective elements arranged in front of said sources to form a corresponding array, said reflective elements positioned and oriented relative to one another and to said sources so as to cause a substantially 90° rotational transformation of light emitted from each source relative to an original orientation of said sources with respect to said array of sources, whereby said lateral and transverse dimensions of each source become the other of said transverse and lateral dimensions of the transformed light,
means for providing a collimated beam from transformed light corresponding to said multiple light sources, said beam collimating means including a lenslet array, each lenslet of said lenslet array positioned in front of a corresponding reflective element at a distance where diverging light emitted from each source intersects and begins to overlap light emitted from adjacent light sources in a line of sources and between any adjacent lines of sources, the light thereby substantially filling each lenslet of said lenslet array, said lenslets having a focal length which is substantially equal to the optical path length from the individual light sources thereto, whereby the light is fully collimated by said lenslets, and means for reimaging said collimated beam into a modified beam, said reimaging means including asymmetric optics having lateral and transverse focal lengths selected to provide a specified lateral-to-transverse size ratio and a corresponding lateral-to-transverse divergence ratio for the modified beam.

30. The optical system of claim 29 wherein said lateral source size, source spacing and asymmetric lens focal lengths are selected such that said lateral-to-transverse size and divergence ratios both equal one.

31. The optical system of claim 29 wherein said array of sources is a linear array with only one line of sources, the number N of sources in said array and the lateral source size $S_H$ being selected such that $$N \approx S_H \sin\theta_H / S_V \sin\theta_V,$$

where $S_V$, $\theta_H$ are respective transverse size, lateral divergence and transverse divergence dimension of each source in said array.

32. The optical system of claim 29 wherein said multiple reflective elements comprise multiple pairs of mirror surfaces, one pair for each source, each pair of mirror surfaces having a first mirror in the path of light emitted from a source and oriented at 45° to said path to reflect said light by 90° within a plane of emission along said line of sources, and a second mirror in the path of light reflected by said first mirror and oriented at 45° to said reflected light path to reflect said light by 90° perpendicular to said plane of emission.

33. The optical system of claim 29 wherein said lenslet array has axially symmetric lenslets selected to provide collimation in both lateral and transverse dimensions.

34. The optical system of claim 29 wherein said lenslet array has cylindrical lenslets selected to provide collimation in the lateral dimension.

35. The optical system of claim 29 wherein said lenslets array is a photolithographically produced microlens array with a lenslet separation period that precisely matches the source spacing.

36. The optical system of claim 29 further comprising an optical fiber waveguide positioned in front of said reimaging means to accept and transmit said modified beam, said specified lateral-to-transverse size ratio and said corresponding lateral-to-transverse divergence ratio of said modification being selected for maximum brightness transmission through said optical fiber waveguide.

37. The optical system of claim 36 wherein said lateral source size, source spacing and lateral and transverse focal lengths of said asymmetric optics are selected such that said lateral-to-transverse size and divergence ratios both equal one and wherein said optical fiber waveguide is a circular core fiber.

38. The optical system of claim 29 wherein said multiple reflective elements and beam collimating means form a single integrated optical element of molded transparent material for each line of sources.

39. The optical system of claim 29 wherein said multiple light sources are semiconductor lasers, said multiple light sources, multiple reflective elements, beam collimating means and reimaging means form a first polarization preserving set of optical elements, the system further comprising a second polarization preserving set of optical elements including a second set of multiple light sources, multiple reflective elements, beam collimating means and reimaging means substantially identical to said first set to produce a second modified beam from light emitted by said second set of multiple light sources with polarization orthogonal to said modified beam of said first set, and means for combining said modified beams from said first and second sets for maximum brightness of the combined beams, said combining means including a polarization sensitive mirror which transmits said first modified beam and reflecting said second modified beam onto a common beam path.

40. The optical system of claim 29 wherein said multiple light source, multiple reflective elements, beam collimating means and reimaging means form a first set of optical elements providing a modified beam of a first wavelength, the system further comprising at least one additional set of optical elements including an additional set of multiple light sources, multiple reflective elements, beam collimating means and reimaging means substantially identical to said first set to provide at least one additional modified beam form light emitted by said additional set of multiple light sources of different wavelength from said modified beam of said first set, and means for combining said modified beam from said first set and said at least one additional set for maximum brightness of the combined beams, said combining means including at least one wavelength sensitive dichroic mirror which transmits said first modified beam and reflecting said additional modified beam onto a common beam path.

41. An optical system comprising,
multiple light sources arranged in a linear array of similar sources that are equally spaced along a single line of sources, said linear array defining a lateral direction along an array axis through said single line of sources and a transverse direction perpendicular to said lateral direction and also perpendicular to a principal direction of propagation of light emitted from said sources, each of said light sources in said array emitting light characterized by lateral and transverse source size and divergence dimensions, the number N of sources in said array and the lateral source size $S_H$ being selected such that $$N \approx S_H \sin\theta_H / S_V \sin\theta_V,$$

where $S_V$, $\theta_H$ and $\theta_V$ are respective transverse size, lateral divergence and transverse divergence dimensions of each source in said array.

multiple pairs of mirror surfaces arranged in front of said sources to form a corresponding linear array, one pair for each source, each pair of mirror surfaces having a first mirror positioned in the path of light emitted from a source and oriented at 45° to said path so as to reflect said light by 90° within a plane of emission along said line of sources, and a second mirror positioned in the path of light reflected by said first mirror and oriented at 45° to said reflected light path so as to reflect said light by 90° into a direction perpendicular to said plane of emission, said multiple pairs of mirror surfaces causing a substantially 90° rotational transformation of light emitted from each source relative to an original orientation of said sources with respect to said linear array of sources, such that said lateral and transverse dimensions characterizing light emitted from each source become the other of said transverse and lateral dimensions characterizing the transformed light, means for providing a collimated beam from transformed light corresponding to said multiple sources, said beam collimating means including a lenslet array, each lenslet of said lenslet array positioned in front of a second mirror of a corresponding pair of mirror surfaces at a distance where diverging light emitted from each source intersects and begins to overlap light emitted from adjacent light sources in said line of sources, the light thereby substantially filling each lenslet of said lenslet array, said lenslets being axially symmetric with focal lengths selected to provide collimation in both lateral and transverse dimensions, and means for reimaging said collimated beam into a modified beam with a specified lateral-to-transverse divergence ratio and a corresponding lateral-to-transverse size ratio which are both equal to one, said reimaging means including an axially symmetric convergent lens in front of said lenslet array, said lens having a diameter of at least a total width $N \times P_o$ of said source array, where $P_o$ is the spacing of said sources, said lens also having a focal length $L_o$ selected such that $[N \times P_o/2 - L_o] = \tan \Theta_H$, where $\theta_H$] $N \times P_o/2L_o = \tan \theta_H'$, where $\theta_H'$ is a specifiable lateral convergence angle of the light after said collimated light has passed through said lens, and an asymmetric lens positioned in front of said axially symmetric lens, said asymmetric lens having a lens size sufficient to capture the transverse divergence of the beam and a transverse focal length selected to provide a transverse waveguide angle $\theta_V$ in the reimaged beam about equal to $\theta_H$ and a transverse size $S_V$ in the reimaged beam about equal to $S_H$, said asymmetric lens leaving said lateral convergence angle $\theta_H$ substantially unaffected.

42. The optical system of claim 41 further comprising an optical fiber with an input centered on said reimaged beam from said asymmetric lens, said optical fiber having a diameter of about $\sqrt{2} \times S_H$ and a numerical aperture of about $\sqrt{2} \times \sin \theta_H$.

43. The optical system of claim 41 further comprising an optical fiber with an input centered on said reimaged beam from said asymmetric lens so as to accept the light of said reimaged beam, said optical fiber having a diameter and numerical aperture selected to maximize brightness within said fiber.

44. The optical system of claim 41 wherein said specifiable lateral convergence angle $\theta_H$ is selected to be less than 15°.

45. The optical system of claim 41 wherein said multiple light sources are semiconductor lasers emitting light with a wavelength selected for optimum pumping of a solid state material.

46. A brightness conserving, asymmetry reducing, laser array system comprising
an array of collinear, laterally spaced apart, laser light emitting sources, said array defining a longitudinal direction along a principal direction of propagation of light emitted from said sources, a lateral direction along an array axis passing through a line of said collinear, laterally spaced apart sources, and a transverse direction perpendicular to both said lateral and longitudinal directions, each of said sources emitting light characterized by a lateral size dimension $S_H$, a transverse size dimension $S_V$, a lateral divergence angle $\theta_H$, a transverse divergence angle $\theta_V$, a lateral component of brightness $B_H$ proportional to $(S_H \sin \theta_H)^{-1}$ and a transverse component of brightness $B_V$ proportional to $(S_V \sin \theta_V)^{-1}$, the array characterized by an array axis passing through each of said sources, a total brightness B proportional to $(1/N) \times B_H \times B_V$ and an intrinsic asymmetry ratio $A = N \times (S_H \sin \theta_H)/(S_V \sin \theta_V)$, where N is the number of sources in the array, means disposed in front of said array of sources for optically transforming light emitted from said array of sources in a manner such that the virtual image of each laser light emitting source has been rotated in the transformed array on the array axis, whereby said lateral and transverse size dimensions and divergence angles have undergone a rotational transformation, the virtual images of the sources in the transformed array still being collinear and lateral spaced, each of the source virtual images in the transformed array characterized by a transformed lateral size dimension $S_H'$, a transformed transverse size dimension $S_V'$, a transformed lateral divergence angle $\theta_H'$, a transformed transverse divergence angle $\theta_V'$, a lateral component of brightness $B_H'$ for the virtual image that is proportional to $(S_H' \sin v_H')^{-1}$ and a transverse component of brightness $B_V'$ for the virtual image that is proportional to $(S_V' \sin \theta_V')^{-1}$, the transformed array characterized by an array axis passing through each of the source virtual images which is parallel to the array axis of the actual array, a total brightness B' proportional to $(1/N) \times B_H' \times B_V'$ and an intrinsic asymmetry ratio for the reimaged array of $A' = N \times (S_H' \sin \theta_H')/(S_V' \sin \theta_V')$, wherein said transformed array substantially conserves brightness such that $B' \approx B$, and wherein said transformed array has an intrinsic asymmetry ration A' which is substantially closer to unity than the intrinsic asymmetry ratio A of the actual array, optics means for collimating the laser light from said reimaged array of sources, and means for focussing said collimated light to a spot.

47. The system of claim 46 wherein said rotational transformation of said sources into said transformed array is by substantially 90 degrees, such that $S_H' = S_V$, $S_V' = S_H$, $\theta_H' = \theta_V$, $\theta_V' = \theta_H$, $B_H' = B_V$ and $B_V' = B_H$.

48. The system of claim 46 wherein said means for optically transforming light emitted rom said array of sources comprises an array of multiple reflection means, each disposed in front of a source, for redirecting light emitted from that source.

49. The system of claim 48 wherein each multiple reflection means in the array of such means comprises a first reflective plane positioned in front of a source so as to intercept laser light emitted from said source, said first reflective plane oriented such that a normal to said first plane has both a lateral component parallel to the array axis X and a longitudinal component parallel to a principal direction Z of light emission from the source whereby said intercepted laser light from said source is reflected off of said first plane into a direction having at least a lateral component, and a second reflective plane positioned in the path of said reflected light so as to intercept said reflected light, said second reflective plane oriented such that a normal to said second plane has both a transverse component in a direction Y perpendicular to said array axis and to said principal direction of light emission and a lateral component, whereby said reflected laser light form said first plane is reflected off of said second plane into a direction having at least a transverse component.

50. The system of claim 49 wherein said first reflective plane is a plane and said second reflective plane is a plane, where is defined as a plane characterized by a line perpendicular thereto with a lateral component of k, a transverse component of l and a longitudinal component of m.

51. The system of claim 46 wherein said optics means comprises a microlens array, each lenslet of said microlens array having a focal length substantially equal to a path length of light from a source through said transforming means to said lenslet, said path length being just sufficient to allow diverging light emitted from each source to just overlap light emitted from adjacent sources, each lenslet of said microlens array being spaced apart from an adjacent lenslet by a separation substantially equal to the spacing between light emitting sources in said array of sources.

52. The system of claim 46 wherein said focussing means has lateral and transverse focal lengths selected to approximately equalize lateral and transverse components of at least one of said spot dimensions and spot convergence angles.

53. The system of claim 52 wherein said focussing means comprises a pair of cylindrical lenses spaced one after the other int he path of said collimated light.

54. A brightness conserving, asymmetry reducing, laser array system comprising an array of collinear, laterally spaced apart, laser light emitting sources, said array defining a longitudinal direction along a principal direction of propagation of light emitted from said sources, a lateral direction along an array axis passing through a line of said collinear, laterally spaced apart sources, and a transverse direction perpendicular to both said lateral and longitudinal directions, and an array of identical reflective prism structures disposed in front of said array of laser light emitting sources, each structure in said array of structures including a first prism with a light admitting face disposed in the path of light emitted in a first direction from a source and with a first reflective surface disposed and oriented to redirect light admitted through said light admitting face into a second direction having at least a lateral direction component, each structure in said array of structures also including a second prism abutting said first prism in the path of said redirected light with a second reflective surface disposed and oriented to again redirect the already once redirected light into a third direction having at least a transverse directional component.

55. The system of claim 54 wherein said structure in said array of structures further includes a cylindrical lenslet disposed in the path of said twice redirected light, said lenslet having a lateral focal length substantially equal to the effective path length of light from said source through said structure to said lenslet.

56. The system of claim 55 further comprising means in the path of said collimated light for focussing said light to a spot.

57. The system of claim 56 wherein said focussing means has lateral and transverse focal lengths selected to approximately equalize at least one of said spot dimensions and spot convergence angles.

58. The system of claim 57 wherein said focussing means comprises a pair of cylindrical lenses spaced one after the other in the path of said collimated light.

59. The system of claim 54 wherein laser light is emitted from each source in a principal direction of (0,0,1), said first reflective surface lies in a plane and said second reflective surface lies in a plane, where is defined as a plane characterized by a line perpendicular thereto with a lateral component of k, a transverse component of l and a longitudinal component of m.

60. The system of claim 54 wherein the number and periodicity of adjacent sources in said array of sources and adjacent prism structures in said array of structures are selected that $N=(S_H \sin \theta_H)/(S_{Vl \sin \theta V})$, where N is the number of sources, and also the number of structures, $S_H$ and $S_V$ are respectively lateral and transverse size dimensions of each source and $\theta_H$ and $\theta_V$ are respectively lateral and transverse divergence angles of each source, and such that $P = 2 L \tan \theta_{V+SV}$, where P is the periodicity of the sources, and also the periodicity of structures in their respective arrays and L is the effective path length of the laser light from the sources through said prism structures to optics means for collimating the light from said prism structures.

* * * * *

UNITED STATES PATENT AND TRADEMARK OFFICE
CERTIFICATE OF CORRECTION

PATENT NO. : 5,168,401
DATED : December 1, 1992
INVENTOR(S) : John Endriz

It is certified that error appears in the above-indentified patent and that said Letters Patent is hereby corrected as shown below:

Column 1, line 42, "10 x 50" should read -- 10° x 50° --.

Column 2, line 11, "N x SH" should read -- N x $S_H$ --.

Column 2, line 13, put a period (.) after the equation.

Column 2, line 14, before the words "transverse component", insert -- Likewise, the --.

Column 4, line 36, "divergence angles $v_V$" should read -- divergence angles $\theta_V$ --.

Column 6, line 1, "divergence angle 8V" should read -- divergence angle $\theta_V$ --.

Column 7, line 35, "$S_V' = S_H'$" should read -- $S_V' = S_H$ --.

Column 9, line 35, "= 5.7°" should read -- = ± 5.7° --.

UNITED STATES PATENT AND TRADEMARK OFFICE
CERTIFICATE OF CORRECTION

PATENT NO. : 5,168,401
DATED : December 1, 1992
INVENTOR(S) : John Endriz

It is certified that error appears in the above-indentified patent and that said Letters Patent is hereby corrected as shown below:

Column 9, line 36, "= 16.6·" should read -- = ± 16.6° --.

Column 10, line 8, "$A_1$?" should read -- "$A_1$" --.

Column 10, line 15, start a new paragraph with the words "As the fill factor F increases. . ."; "$F^{\frac{1}{2}}$" should read -- $F^{-\frac{1}{2}}$ --.

Column 12, line 37, "or a cylindric lenses" should read -- or acylindric lenses --.

Column 14, line 17, "source size __ μm" should read -- source size __ 167 μm --.

Claim 1, column 15, line 43, "emitted form" should read -- emitted from --.

Claim 9, column 16, line 7, "light form said sources" should read -- light from said sources --.

Claim 24, column 16, line 67, before the phrase "lines of sources" insert -- light sources in a line of sources and between any adjacent --.

Claim 29, column 17, line 30, "at last one" should read -- at least one --.

UNITED STATES PATENT AND TRADEMARK OFFICE
CERTIFICATE OF CORRECTION

PATENT NO. : 5,168,401
DATED : December 1, 1992
INVENTOR(S) : John Endriz

It is certified that error appears in the above-indentified patent and that said Letters Patent is hereby corrected as shown below:

Claim 30, column 18, line 18, "where $S_V$, $\theta_H$ are" should read -- where $S_V$, $\theta_H$ and $\theta_V$ are --.

Claim 40, column 19, line 11, "light source" should read -- light sources --.

Claim 40, column 19, line 19, "form light emitted" should read -- from light emitted --.

Claim 41, column 20, lines 23-24, delete bracketed portion "[N x $P_O/2L_O$ = tan $\theta_H$, where $\theta_H$]".

Claim 46, column 21, lines 17-18, "lateral spaced" should read -- laterally spaced --.

Claim 46, column 21, line 25, "$(S_H' \sin v_H')^{-1}$" should read -- $(S_H' \sin \theta_H')^{-1}$ --.

Claim 48, column 21, line 47, "emitted rom said array" should read -- emitted from said array --.

Claim 49, column 22, line 2, "light form said first plane" should read -- light from said first plane --.

Claim 50, column 22, line 6, "is a plane" should read -- is a [101] plane; line 7, "a plane"

UNITED STATES PATENT AND TRADEMARK OFFICE
CERTIFICATE OF CORRECTION

Page 4 of 5

PATENT NO. : 5,168,401
DATED      : December 1, 1992
INVENTOR(S) : John Endriz

It is certified that error appears in the above-indentified patent and that said Letters Patent is hereby corrected as shown below:

should read - - a [110] plane - -; and "where is defined" should read - - where [klm] is defined - -.

Claim 53, column 22, line 29, "int he" should read - - in the - -.

Claim 54, column 22, line 34, "along a principal direction" should read - - parallel to a principal direction - -.

Claim 54, column 22, line 48, "a lateral direction" should read - - a lateral directional - -.

Claim 55, column 22, line 56, "said structure" should read - - each structure - -.

Claim 59, column 23, line 6, "in a plane" should read - - in a [101] plane - -; line 7, "in a plane" should read - - in a [110] plane - -; and line 7, "where is" should read - - where [klm] is - -.

Claim 60, column 24, line 1, "$(S_{V1} \sin \theta_V)$" should read - - $(S_V \sin \theta_V)$ - -.

UNITED STATES PATENT AND TRADEMARK OFFICE
CERTIFICATE OF CORRECTION

PATENT NO. : 5,168,401
DATED : December 1, 1992
INVENTOR(S) : John Endriz

It is certified that error appears in the above-indentified patent and that said Letters Patent is hereby corrected as shown below:

Claim 60, column 24, line 6, "$P=2 L \tan\theta_V + SV$" should read-- $P=2 L \tan\theta_V + S_V$ --.

Signed and Sealed this

Twenty-fourth Day of August, 1993

*Attest:*

BRUCE LEHMAN

*Attesting Officer*    *Commissioner of Patents and Trademarks*